US008299356B2

(12) United States Patent
Uno et al.

(10) Patent No.: US 8,299,356 B2
(45) Date of Patent: Oct. 30, 2012

(54) BONDING WIRE FOR SEMICONDUCTOR DEVICES

(75) Inventors: Tomohiro Uno, Tokyo (JP); Keiichi Kimura, Tokyo (JP); Takashi Yamada, Saitama (JP)

(73) Assignees: Nippon Steel Materials Co., Ltd., Tokyo (JP); Nippon Micrometal Corporation, Saitama (JP)

( * ) Notice: Subject to any disclaimer, the term of this patent is extended or adjusted under 35 U.S.C. 154(b) by 61 days.

(21) Appl. No.: 12/669,662

(22) PCT Filed: Dec. 2, 2008

(86) PCT No.: PCT/JP2008/071899
§ 371 (c)(1),
(2), (4) Date: Jun. 25, 2010

(87) PCT Pub. No.: WO2009/072498
PCT Pub. Date: Jun. 11, 2009

(65) Prior Publication Data
US 2010/0294532 A1    Nov. 25, 2010

(30) Foreign Application Priority Data

Dec. 3, 2007   (JP) .................................. 2007-312238
Nov. 19, 2008  (JP) .................................. 2008-295178

(51) Int. Cl.
*H01B 7/00* (2006.01)
(52) U.S. Cl. .................. 174/36; 174/110 R; 174/120 R; 174/126.1; 174/126.2
(58) Field of Classification Search ................. 174/94 R, 174/84 R, 102 R, 103, 108, 109, 126.1, 126.2, 174/36, 120 R, 121 R
See application file for complete search history.

(56) References Cited

U.S. PATENT DOCUMENTS

| 6,140,583 | A  | * | 10/2000 | Suzuki et al. ................ 174/68.1 |
| 2004/0014266 | A1 | * | 1/2004 | Uno et al. ..................... 438/200 |
| 2005/0079347 | A1 | * | 4/2005 | Uno et al. ..................... 428/364 |
| 2005/0151253 | A1 |   | 7/2005 | Nonaka et al. |
| 2007/0235887 | A1 |   | 10/2007 | Kaimori et al. |

FOREIGN PATENT DOCUMENTS

| EP | 1447842 A1 * | 8/2004 |
| GB | 2 248 416 | 4/1992 |
| JP | 5848948 A1 | 3/1984 |

(Continued)

OTHER PUBLICATIONS

Cho et al, "Recrystallization and Grain Growth of Cold-Drawn Gold Bonding Wire". Metallurgical and Materials Transactions. vol. 34A. May 2003. pp. 1113-1125.

(Continued)

*Primary Examiner* — William Mayo, III
(74) *Attorney, Agent, or Firm* — McDermott Will & Emery LLP

(57) ABSTRACT

A semiconductor-device bonding wire includes a core member formed of an electrically-conductive metal, and a skin layer mainly composed of a face-centered cubic metal different from the core member and formed thereon. An orientation ratio of <111> orientations in crystalline orientations <hkl> in a wire lengthwise direction at a crystal face of a surface of the skin layer is greater than or equal to 50%, and the <111> orientations have an angular difference relative to the wire lengthwise direction, the angular difference being within 15 degrees.

26 Claims, 1 Drawing Sheet

WIRE LENGTHWISE DIRECTION

FOREIGN PATENT DOCUMENTS

| | | | |
|---|---|---|---|
| JP | 62097360 A | | 5/1987 |
| JP | 04079236 A | | 3/1992 |
| JP | 04079240 A | | 3/1992 |
| JP | 04079242 A | | 3/1992 |
| JP | 2002-319597 A | | 10/2002 |
| JP | 2004-14884 A | | 1/2004 |
| JP | 2004031469 A | | 1/2004 |
| JP | 2004064033 A | | 2/2004 |
| JP | 2004228541 A | | 8/2004 |
| JP | 2004-281877 | | 10/2004 |
| JP | 2006-100777 | * | 3/2005 |
| JP | 2005-268771 | * | 9/2005 |
| JP | 2006190763 A | | 7/2006 |
| JP | 2006216929 A | | 8/2006 |
| JP | 2007012776 A | | 1/2007 |
| JP | 2007123597 A | | 5/2007 |
| WO | WO 01/29889 | | 4/2001 |
| WO | 0223618 A1 | | 3/2002 |
| WO | 03/036710 A1 | | 5/2003 |
| WO | 03/081661 A1 | | 10/2003 |
| WO | 2005/038902 A1 | | 4/2005 |

OTHER PUBLICATIONS

European Search report issued in European Patent Application No. 08858289.5 dated May 9, 2012.

* cited by examiner

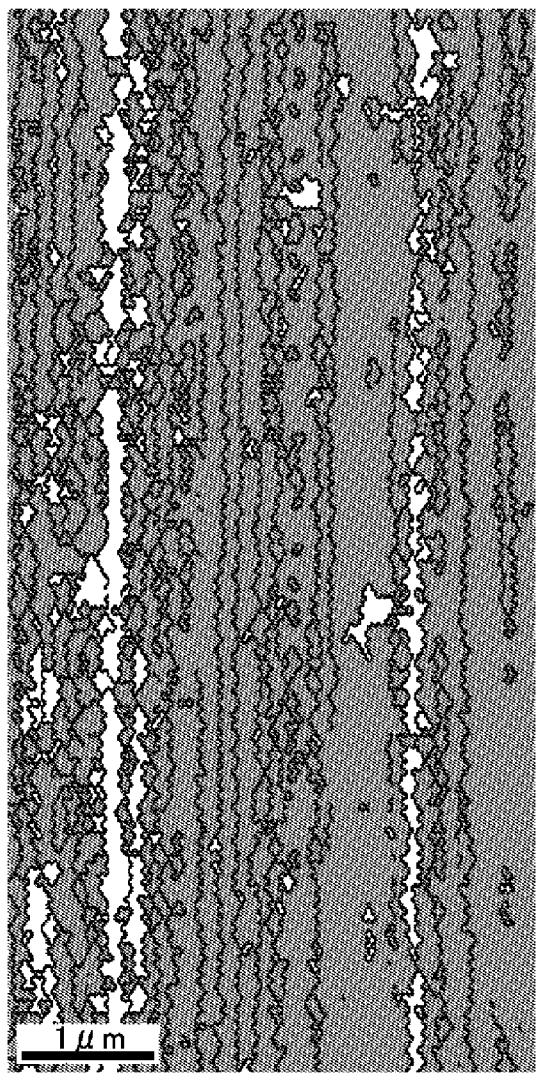

BONDING WIRE FOR SEMICONDUCTOR DEVICES

CROSS-REFERENCE TO PRIOR APPLICATION

This is the U.S. National Phase Application under 35 U.S.C. §371 of International Patent Application No. PCT/JP2008/071899 filed Dec. 2, 2008, which claims the benefit of Japanese Patent Application No. 2007-312238, filed Dec. 3, 2007, and Japanese Patent Application No. 2008-295178, filed Nov. 19, 2008, all of which are incorporated by reference herein. The International Application was published in Japanese on Jun. 11, 2009 as WO2009/072498 A1 under PCT Article 21(2).

TECHNICAL FIELD

The present invention relates to a semiconductor-device bonding wire for connecting an electrode on a semiconductor element and an external terminal together.

BACKGROUND ART

Currently, thin wires (bonding wires) having a wire diameter of 20 to 50 μm or so are popularly used as bonding wires for connecting an electrode on a semiconductor element and an external terminal together which is a wiring of a circuit wiring board (a lead frame, a substrate, a tape or the like). A thermal compressive bonding technique with the aid of ultrasound is generally applied to bond bonding wires, and a general-purpose bonding device, and a capillary jig which allows a bonding wire to pass through the interior thereof for connection are used. A leading end of a bonding wire is heated and melted by arc heat inputting, a ball is formed by surface tension, and then the ball is compressively bonded on an electrode of a semiconductor element heated within a range from 150 to 300° C. beforehand. Thereafter, the bonding wire is directly bonded to an external lead by ultrasound compressive bonding.

Recently, technologies related to the structure, material and connection for the semiconductor packaging technologies are rapidly diversified, and for example, in a packaging structure technology, in addition to currently-used QFP (Quad Flat Packaging) using a lead frame, new configurations, such as BGA (Ball Grid Array) using a substrate, a polyimide tape or the like and CSP (Chip Scale Packaging) are practically used, and a bonding wire which has improved loop characteristic, bonding property, mass productivity, usability and the like becomes requisite.

Introduction of a fine pitch technique that a space between adjacent bonding wires becomes narrow has progressed. Thinning, improvement of strength, loop controllability, and bonding property become requisite for bonding wires in accordance with the introduction of the fine pitch technique. A loop shape becomes complex together with the density growth of the semiconductor packaging technologies. A loop height and a wire length (span) of a bonding wire are barometers for classification of the loop shape. In most-recent semiconductor devices, contradictory loop shapes, such as a high loop and a low loop, and, a short span and a long span, are mixed within the interior of a single package. In order to realize such contradictory loop shapes with a bonding wire of one kind, a strict designing of a material of a bonding wire is essential.

So far, 4N-group gold having a high purity (purity >99.99% by weight) is used as a material of a bonding wire. In order to improve strength and a bonding property, a tiny amount of alloy elements are prepared. Recently, a gold alloy wire with a purity of 2N (purity >99%) that an additive element concentration is increased to less than or equal to 1% becomes into practical use in order to improve the reliability of a bonded part. The strength can be improved and the reliability can be controlled by adjusting the kind and the concentration of an alloy element added to gold. Conversely, alloying may cause deterioration of a bonding property and increment of an electrical resistance, so that it is difficult to comprehensively satisfy various characteristics requisite for the bonding wires.

Moreover, because gold is expensive, other kinds of metals which have a low material cost are desired, and bonding wires which have a low material cost, have a good electrical conductivity and are made of copper are created. According to the copper bonding wires, however, a bonding strength is reduced due to oxidization of a wire surface, and a wire surface is likely to be corroded when encapsulated in a resin. These are the reasons that practical usage of the copper bonding wires is not accelerated.

All bonding wires in practical use so far have a monolayer structure. Even if materials, such as gold and copper, are changed, alloy elements are uniformly contained in a bonding wire, and a wire monolayer structure is employed as viewed from a cross section of a bonding wire. A thin native oxide film, an organic film for protecting a surface and the like may be formed on a wire surface of a bonding wire in some cases, these are limited in an extremely-thin area (up to several atomic layer level) in an outermost surface.

In order to meet various needs requisite for the bonding wires, a bonding wire with a multilayer structure in which a wire surface is coated with another metal is proposed.

As a technique of suppressing any oxidization of a surface of a copper bonding wire, patent literature 1 discloses a bonding wire in which copper is covered with a noble metal or a corrosion-resistant metal, such as gold, silver, platinum, palladium, nickel, cobalt, chrome, titanium, and the like. Moreover, from the standpoint of a ball formability and suppression of deterioration of a plating solution, patent literature 2 discloses a bonding wire so structured as to have a core member mainly composed of copper, a dissimilar metal layer formed on the core member and made of a metal other than copper, and a coating layer formed on the dissimilar metal layer and made of an oxidization-resistant metal having a higher melting point than copper. Patent literature 3 discloses a bonding wire comprising a core member mainly composed of copper, and an outer skin layer which contains a metal, having either one of or both of a constituent and a texture different from the core member, and copper, and which is a thin film having a thickness of 0.001 to 0.02 μm.

Various gold bonding wires with a multilayer structure have been proposed. For example, patent literature 4 discloses a bonding wire comprising a core wire formed of highly-pure Au or Au alloy, and a coating material coating an outer surface of the core wire and formed of a highly-pure Pd or Pd alloy. Patent literature 5 discloses a bonding wire comprising a core wire formed of highly-pure Au or Au alloy, and a coating material coating an outer surface of the core wire and formed of highly-pure Pt or Pt alloy. Patent literature 6 discloses a bonding wire comprising a core wire formed of highly-pure Au or Au alloy, and a coating material coating an outer surface of the core wire and formed of highly-pure Ag or Ag alloy.

It is desirable to cope with the most advanced fine pitch technique and high-density packaging technique like three-dimensional wiring by satisfying comprehensive characteristics such that loop control is stable in a bonding process, a bonding property is improved, deformation of a bonding wire at the time of resin encapsulation is suppressed, and a long-term reliability of a bonded part is accomplished as wire characteristics of a bonding wire of mass-production.

Regarding ball bonding, it is important to form a ball with a good sphericity at the time of ball formation, and to obtain a sufficient bonding strength between the ball and an electrode. Moreover, in order to cope with lowering of a bonding temperature and thinning of a bonding wire, a bonding strength, a tensile strength and the like are requisite at a part where a bonding wire is subjected to wedge bonding to a wiring on a circuit wiring board.

A surface nature of a wire affects a use performance, and for example, merely creation of a flaw and that of scraping make mass-production difficult. Adjoining bonding wires may be electrically short-circuited due to scraping, and a flaw makes the quality and reliability of a bonding wire, such as a manufacturing yield of a bonding wire and wire deformation at the time of resin encapsulation, deteriorated. Moreover, practical use cannot be accomplished if strict requisitions such that a failure occurrence rate of a semiconductor manufacturing process is managed in a ppm order are not satisfied by further pursuing a stability of loop-shape control and by further improving a bonding property at a low temperature.

Such bonding wires with a multilayer structure for semiconductors have large anticipation for practical use, but have not become in practical use. Reforming of a surface, a high added value, and the like by the multilayer structure is anticipated, but in contrast, it is necessary to comprehensively satisfy a productivity of a bonding wire, a quality thereof, a yield in a bonding process, performance stability, and a long-term reliability at the time of semiconductor usage.

Patent Literature 1: JPS62-97360A
Patent Literature 2: JP2004-64033A
Patent Literature 3: JP2007-12776A
Patent Literature 4: JPH04-79236A
Patent Literature 5: JPH04-79240A
Patent Literature 6: JPH04-79242A

DISCLOSURE OF INVENTION

Problem to be Solved by the Invention

According to the conventional bonding wires with a monolayer structure (hereinafter, "monolayer wire"), addition of an alloy element is effective to improve a tensile strength, a strength of a bonded part, a reliability thereof, and the like, but it is thought that there is a limit in improvement of the characteristics. According to the bonding wires with a multilayer structure (hereinafter, "multilayer wire"), it is anticipated that the characteristics are further improved in comparison with the monolayer wires to improve an added value. Regarding the multilayer wires bringing a high functionality, a wire surface can be coated with a noble metal or an oxidation-resistant metal to suppress any oxidization of a surface of a copper bonding wire. For gold bonding wires, it is anticipated to accomplish an effect of reducing resin sweep by coating a wire surface with a metal or an alloy having a high strength.

However, according to the study of the inventors of the present invention in consideration of density growth, miniaturization, and thinning of the semiconductor packaging technology, it becomes clear that the multilayer wires have lots of following practical problems.

Regarding the multilayer wires, a flaw, scraping and the like are likely to be formed on a surface of a wire because of drawing in a wire manufacturing process and complex loop control in a wire bonding process when a multilayer wire is used as a wire final product or used for connecting a semiconductor element. For example, a flaw of a wire surface may create a minute groove in a submicron order, and as a failure example of scraping, shaved-piece-like scraping is created in the lengthwise direction of a multilayer wire, and the length of such scraping becomes up to several hundred μm. The flaw and scraping on a surface make a loop shape unstable, a multilayer wire is damaged so that the strength thereof is reduced, and if a scraped piece contacts adjoining multilayer wires, it causes short-circuiting, resulting in practical problems.

The thinner a wire diameter is, the more the frequency of occurrence of failures relating to a flaw and scraping on a surface increases, and it is not appropriate for fine pitch connection, and such a frequency also increases as loop control becomes complex such that a high loop and a low loop are mixed, and it is difficult to apply the multilayer wires to three-dimensional connection. The frequency of occurrence of a surface flaw is likely to increase when a low loop is formed. If such failure is not reduced, the practical application of the multilayer wires is still limited.

In addition to such direct failures, indirect failures due to a flaw and scraping on a wire surface, or reduction of the yield are also concerned. For example, a flaw and scraping once created in the middle stage of manufacturing of multilayer wires cannot be detected from a final product, but make the thickness of a skin layer uneven, and make a loop shape unstable as an internal crack remains. Moreover, a flaw and scraping created in the back of a loop are not likely to be detected through a loop external appearance test using an optical microscope in a mass-production stage. Such failures result in reduction of a manufacturing yield even though direct causal relationships with a flaw and scraping are not acknowledged easily.

The frequency of occurrence of a surface flaw and scraping and phenomenon thereof vary depending on a material of a skin layer, but there is no sufficient countermeasure so far. The occurrence frequency in the case of the multilayer wires often increases in comparison with the case of the monolayer wires, and it is thought that this is because, in the multilayer wires, loads, such as stress and strain, relative to a skin layer increase in a process of forming a loop and because a process condition differs in wire manufacturing processes.

When a loop is formed using a multilayer wire, the linearity of the loop may decrease, and defects, such as fall-down, grow-down and bending of the multilayer wire may occur. As the linearity of the loop decreases, a manufacturing yield also decreases.

Typical defects of a ball bonded part of the multilayer wires are a petal-like deformation phenomenon and a misalignment phenomenon. The petal-like deformation phenomenon is that roundness is deteriorated as the proximity of the outer circumference of a ball bonded part is deformed in a petal-like shape concavely and convexly, so that a ball is out of an area of an electrode when bonded on a small electrode, and is a cause of failure like reduction of a bonding strength. The misalignment phenomenon is that a ball formed at a leading end of a wire is unsymmetrically formed relative to a wire axis and the wire is formed in a shape like a golf club, and when a misaligned ball is bonded in fine pitch connection, such a ball may contact an adjoining ball, resulting in a short-circuiting. The occurrence frequencies of the petal-like deformation phenomenon and the misalignment phenomenon in the case of the multilayer wires tend to increase in comparison with the case of the monolayer wires, resulting in reduction of the productivity, so that it is necessary to tighten management criteria for the wire bonding process.

It is anticipated that the multilayer copper wires have a better effect of delaying oxidization than the monolayer copper wires, but such an effect largely varies depending on a texture, a structure, a thickness, and the like at a skin layer or at the proximity of a wire surface. It is important to make the structure of the multilayer copper wires appropriate. In order to ensure the same workability as that of gold wires, for example, it is necessary to ensure that a wedge bonding property, a loop shape and the like are not deteriorated even after wires are stored for two months or so in a normal atmosphere. This requires improvement of a life several ten times in comparison with the storage life of the monolayer copper wires, so that a considerably hard condition is required for materials mainly composed of copper.

It is an object of the present invention to provide a semiconductor-device bonding wire which can overcome the problems of the conventional technologies, suppress any formation of flaws and scraping on a wire surface, and accomplish improvement of characteristics, such as stabilization of a loop shape and good ball formation, in addition to conventional basic characteristics.

Means for Solving the Problem

In order to overcome problems, such as flaws and scraping on a wire surface, the inventors of the present invention keenly studied bonding wires with a multilayer structure, and found that it is effective to control a texture of a specific skin layer.

The present invention has been made based on the foregoing knowledge, and employs following structures.

A bonding wire for semiconductor devices according to the first aspect of the present invention comprises: a core member formed of an electrically-conductive metal; and a skin layer formed on the core member and mainly composed of a different metal from the core member, and wherein the metal of the skin layer is a face-centered cubic metal, and a percentage of <111> orientation in crystalline orientations <hkl> in a lengthwise direction at a crystal face of a surface of the skin layer is greater than or equal to 50%.

According to the semiconductor-device bonding wire with the foregoing structure according to the second aspect of the present invention, wherein a total percentage of <111> orientation and <100> orientation in the crystalline orientations <hkl> in the lengthwise direction at the crystal face of the surface of the skin layer is greater than or equal to 60%.

According to the semiconductor-device bonding wire with the foregoing structure according to the third aspect of the present invention, wherein a total percentage of <111> orientation and <100> orientation in the crystalline orientations <hkl> in the lengthwise direction at a crystal face of a cross section of the core member is greater than or equal to 15%.

According to the semiconductor-device bonding wire with the foregoing structure according to the fourth aspect of the present invention, wherein a percentage of <111> orientation and <100> orientation in the crystalline orientations <hkl> in the wire lengthwise direction at the crystal face of the cross section of the core member is greater than or equal to 30%.

According to the semiconductor-device bonding wire with the foregoing structure according to the fifth aspect of the present invention, wherein a ratio of an average size of a crystal grain at the surface of the skin layer in the lengthwise direction relative to an average size of the crystal grain at the surface of the skin layer in the circumferential direction is greater than or equal to three.

According to the semiconductor-device bonding wire with the foregoing structure according to the sixth aspect of the present invention, wherein a percentage of an area of crystal grains where crystalline orientation in the wire lengthwise direction at the surface of the skin layer is <111> is greater than or equal to 30% relative to a total area of a wire surface.

According to the semiconductor-device bonding wire with the foregoing structure according to the seventh aspect of the present invention, wherein a main constituent of the skin layer is at least one kind of followings: Pd; Pt; Ru; and Ag.

According to the semiconductor-device bonding wire with the foregoing structure according to the eighth aspect of the present invention, wherein a main constituent of the core member is at least one kind of followings: Cu; and Au.

The semiconductor-device bonding wire with the foregoing structure according to the ninth aspect of the present invention further comprising an intermediate metal layer formed between the skin layer and the core member and composed of a different constituent from the main constituent of the skin layer and the main constituent of the core member.

According to the semiconductor-device bonding wire with the foregoing structure according to the tenth aspect of the present invention, wherein a thickness of the skin layer is within a range from 0.005 to 0.2 μm.

The semiconductor-device bonding wire with the foregoing structure according to the eleventh aspect of the present invention further comprising a diffusion layer formed between the skin layer and the core member and having a concentration gradient.

According to the semiconductor-device bonding wire with the foregoing structure according to the twelfth aspect of the present invention, wherein the main constituent of the core member is Cu and the core member contains greater than or equal to one kind of followings: B; Pd; Bi; P; and Zr at a concentration within a range from 5 to 300 ppm.

According to the semiconductor-device bonding wire with the foregoing structure according to the thirteenth aspect of the present invention, wherein the main constituent of the core member is Cu and the core member contains Pd at a concentration within a range from 5 to 10000 ppm, and the main constituent of the skin layer is Pd or Ag.

According to the semiconductor-device bonding wire with the foregoing structure according to the fourteenth aspect of the present invention, wherein the main constituent of the core member is Au and the core member contains greater than or equal to one kind of followings: Be; Ca; Ni; Pd and Pt at a concentration within a range from 5 to 8000 ppm.

Effect of the Invention

The semiconductor-device bonding wire of the present invention suppresses any formation of flaws and scraping on a wire surface, thereby improving a surface nature. Moreover, the linearity of a loop and the stability of loop heights are improved. Furthermore, stabilization of a bonding shape of the semiconductor-device bonding wire is promoted. As a result, there is provided the highly-functional semiconductor-device bonding wire which can cope with latest semiconductor packaging technologies, such as thinning, a fine pitch, a long span, and three-dimensional packaging.

BRIEF DESCRIPTION OF DRAWINGS

FIG. 1 shows an EBSP measurement result of a bonding wire (wire diameter: 25 μam) with a multilayer structure (an area oriented to <111> orientation is colored. A crystalline interface is indicated by a line).

BEST MODE FOR CARRYING OUT THE INVENTION

Regarding semiconductor-device bonding wires (hereinafter, "bonding wires"), one comprising a core member formed of an electrically-conductive metal and a skin layer formed on the core member and mainly composed of a face-centered cubic metal different from the core member were studied, and it became clear that a wedge bonding property can be improved if an electrically-conductive metal are contained in the proximity of a surface of a bonding wire, but formation of a flaw, scraping and the like on a wire surface by wire drawing in a wire manufacturing process and by complex loop control in a wire bonding process becomes a problem, and the stability of a loop shape is insufficient.

Accordingly, the inventors of the present invention studied bonding wires with a multilayer structure which can cope with new needs like strict loop control in fine pitch connection and in three-dimensional connection, and which can accomplish improvement of a yield in drawing of a thin wire, and found that controlling of a texture of a specific skin layer is effective. In particular, the inventors of the present invention focused on a relation, which was hardly known so far, between a texture of a surface of multilayer wires and the usability of bonding wires, and verified that the workability, the bonding property, the loop controllability and the like can be comprehensively improved by controlling a specific crystalline orientation. Moreover, the inventors of the present invention found out that controlling of a combination of the texture of the skin layer and that of the core member is further effective.

That is, it is necessary that such a bonding wire must comprise a core member formed of an electrically-conductive metal and a skin layer formed on the core member and mainly composed of a face-centered cubic metal different from the core member, wherein greater than or equal to 50% of crystalline orientations <hkl> in the lengthwise direction at a crystal face of a surface of the skin layer is <111>. According to such a bonding wire, a superior effect of suppressing any formation of flaws and scraping on a wire surface by wire drawing in a wire manufacturing process and by complex loop control in a wire bonding process can be accomplished.

If a constituent of the skin layer is a face-centered cubic metal, there is no yield drop at the time of working, and the workability is good, resulting in facilitation of adaptation to complex working, bending and the like in wire drawing and loop controlling.

As greater than or equal to 50% of the crystalline orientations <hkl> in the lengthwise direction of a bonding wire is <111>, a set of characteristics, such as the surface strength of the skin layer, a workability, a bending tolerability and the like which are difficult to accomplish simultaneously can be improved, and as a result, any formation of flaws and scraping on a wire surface can be suppressed. The <111> orientation of the face-centered cubic metal is a most dense direction, and if such <111> orientations are collected in the skin layer, the mechanical strength of the surface is likely to increase more, and for example, the strength is enhanced, the tolerability against elastic deformation and the tolerability against plastic deformation become high, and the toughness can be also enhanced. If the percentage of the <111> orientations in the crystalline orientations is greater than or equal to 50%, a sufficient effect of suppressing any formation of flaws and scraping on a wire surface can be accomplished. Preferably, if the percentage of the <111> orientations is greater than or equal to 60%, an effect of suppressing any formation of scraping is further improved, and formation of any scraping and flaw can be reduced at a long span in which a wire length is greater than or equal to 5 mm. More preferably, if it is greater than or equal to 70%, an effect of suppressing any formation of flaws is further improved, and formation of any flaw and scraping can be suppressed even in the case of formation of a low loop in which a loop height is, for example, less than or equal to 65 μm, and formation of a loop can be stabilized.

According to the multilayer wires, because the skin layer and the core member are formed of different constituents, it is relatively easy to separately control a texture of the skin layer covering a wire surface. Controlling of the surface texture also brings a good effect of characteristic improvement. It is thus different from texture controlling in the case of the conventional monolayer wires. According to the monolayer wires, it is possible to manage a texture of a whole wire and a crystalline orientation, but it is difficult to control a texture of only proximity of the surface separately from the interior of the wire. Accordingly, a unique scheme for the case of the multilayer wires is required for controlling a texture of the skin layer of the multilayer wires, and management scheme of a texture and a crystalline orientation in a wire cross section in the case of the monolayer wires cannot be applied.

If the total percentage of <111> and <100> orientations in the crystalline orientations <hkl> in the lengthwise direction at the crystal face of the surface of the skin layer is greater than or equal to 60%, dispersion in loop heights can be reduced, and controlling of the stability of a loop at a fast operation speed becomes easy. In a normal wire connecting process, a bonding wire passing through an aperture of a capillary is subjected to complex motion, such as pulling-out and pulling-back. This is a motion that the bonding wire is pulled out and pulled back at a very fast speed in an order of several ten milliseconds. Specific effects of individual <111> and <100> orientations and a correlation therebetween are not clear yet, but it is thought that a loop height is stabilized as a sliding resistance between the bonding wire and the capillary is reduced. In other words, in order to stabilize the slidability and the loop height, it is effective to suppress any crystalline orientations other than <111> and <100> orientations. If the total percentage of <111> and <100> orientations in the skin layer is greater than or equal to 60%, a good effect of stabilizing a loop height at a normal span in which a wire length is less than or equal to 3 mm can be accomplished. Preferably, if it is greater than or equal to 80%, a good effect of stabilizing a loop height can be accomplished at a long span in which a wire length is greater than or equal to 5 mm. Moreover, as an effect accomplished by increasing the percentage of the <111> and <100> orientations, unevenness of a film thickness in a working after formation of the film and in a thermal treatment process can be suppressed, making the thickness of the skin layer uniform.

If the total percentage of the <111> and <100> orientations in the crystalline orientations <hkl> in the wire lengthwise direction at a cross section of the core member is greater than or equal to 15%, it is possible to suppress any failures that a ball bonded part is abnormally deformed and is out of a true circle. Such abnormal deformation may directly cause electrical short-circuiting with adjoining electrode, and is one of failures most concerned in ball bonding. As a rough indication for a criterion for checking abnormal deformation, an elliptical shape that a ratio between a longer diameter size of a ball bonded part and a shorter diameter size thereof is greater than or equal to 1.3 times is determined as a failure. Even if such a failure occurs in an unexpected fashion at a low occurrence rate, it deteriorates the productivity of the bonding wire. Preferably, if the total percentage of <111> and <100> orientations is greater than or equal to 30%, a tiny petal-like deformation failure that the proximity of the outer circumference of a ball bonded part deform concavely and convexly can be suppressed, the ball bonded part becomes close to a true circle and is stabilized. Good roundness is advantageous for reduction of a bonding area, so that manufacturing management in a bonding process is facilitated, and the productivity in fine pitch connection is also improved. It is verified that the solidification structure of a ball greatly reflects the texture of the core member, and increment of the percentage of <111> and <100> orientations in the crystalline orientations <hkl> of the core member is effective. It is verified that such controlling of crystalline orientations of the core member does not bring a sufficient effect in the case of the monolayer wires, but brings a good effect in the case of the multilayer wires. The reason why is not completely clarified yet, but it is thought that the texture of the core member significantly affects the texture of a ball because the skin layer is melted first, and the core member is then melted step by step in ball melting of the multilayer wires. It is verified that better action and effect can be accomplished when a ball is in a normal ball size. For example, when a ball in a normal size that the ratio between an initial ball diameter and a wire diameter is 1.9 to 2.2 is bonded, anisotropy and a shape failure like petal-like deformation at a ball bonded part can be suppressed, thereby improving the roundness. The inventors of the present invention studied deformation behavior of a ball by compressive deformation and application of ultrasound, and verified that a correlation between a ball bonding shape and the texture of the skin layer is little, but the texture of the core member dominantly affects. If the percentage of <111> and <100> orientations in the core member is less than 15%, the frequency of occurrence of abnormal deformation at the time of ball bonding increases, and if it is less than 30%, the frequency of occurrence of deformation in a petal-like shape and an elliptical shape increases, resulting in a failure occasionally. The effect of the texture of the wire on ball deformation is remarkable in the case of the multilayer wires, and is different from the effect of the texture of the monolayer wires in many cases. Preferably, if the total percentage of <111> and <100> orientations in the core member is greater than or equal to 50%, a ball with a small diameter can have a stable bonding shape. For example, when a ball with a small diameter that the ratio between an initial ball diameter and a wire diameter is 1.5 to 1.7 is subjected to bonding, if the roundness of a ball bonded part is improved, a good ball bonding shape can be acquired even in the case of a fine pitch connection with an electrode clearance less than or equal to 40 μm. There is no specific uppermost limit for the percentage of the <111> and <100> orientations in the core member, but if it is less than or equal to 85%, there is an advantage that controlling at the time of manufacturing becomes relatively easy.

A synergistic effect by combining the texture of the core member and the texture of the skin layer is anticipated which simultaneously improves controlling of a loop shape and stabilization of ball deformation. That is, it is desirable that a bonding wire with a multilayer structure should have a composition in which greater than or equal to 50% of the crystalline orientations <hkl> in the lengthwise direction at a crystal face of the surface of the skin layer is <111> and the percentage of <111> and <100> orientations in the crystalline orientations <hkl> in the wire lengthwise direction at a cross section of the core member is greater than or equal to 40%. Accordingly, the comprehensive characteristics of the bonding wire can be improved in three-dimensional packaging, such as stacked-chip connection that a plurality of chips are stacked together, and multi-tier bonding that the loop heights of adjoining bonding wires largely vary within a range from 60 to 500 μm which is recently applied to BGA and CSP.

The explanation has been given of the action and the effect of the percentage of specific orientations with reference to measurable crystalline orientations. If thinning advances in near future for coping with accomplishment of a fine pitch, the degree of influence by a surface increases, so that it becomes possible to figure out the effect of practical use if the effect of crystalline orientation is organized with reference to the surface of a bonding wire.

More specifically, it is desirable that a bonding wire with a multilayer structure should have a composition in which greater than or equal to 50% of the crystalline orientations <hkl> in the lengthwise direction at the crystal face of the surface of the skin layer is <111> and an area of crystal grains where the crystalline orientations in the wire lengthwise direction at the surface of the skin layer is <111> is greater than or equal to 30% as a ratio relative to the total area of the wire surface. Accordingly, an effect of stabilizing a loop shape is enhanced, and in particular, a loop characteristic is stabilized even in the case of a bonding wire thinned so as to have a diameter less than or equal to 22 μm, and it is effective for reduction of any formation of flaws and scraping. According to a thin bonding wire having a wire diameter less than or equal to 22 μm, due to increment of strain by wire drawing or the like, an area of crystalline orientations which are difficult to measure increases, so that an area where a loop characteristic cannot be precisely grasped only through the percentage of the <111> orientations in the measurable crystalline orientations is likely to increase. Therefore, if the area of crystal grains having the <111> orientation in the surface of the skin layer is set to be an appropriate ratio (appropriate area ratio) in a ratio (area ratio) relative to the total area of the wire surface, good characteristics can be acquired even in the case of thin wires. The reason why the area ratio is set to be greater than or equal to 30% is because any formation of flaws and scraping cannot be suppressed in some case when fine pitch connection is carried out using a bonding wire with a wire diameter less than or equal to 22 μm if the area ratio is less than 30% even though greater than or equal to 50% of the crystalline orientations is <111>. Preferably, if the area ratio is greater than or equal to 40%, any formation of flaws and scraping even when a thin wire with a wire diameter of less than or equal to 18 μm is connected to form a loop. More preferably, if the area ratio is greater than or equal to 50%, an effect of suppressing any formation of flaws and scraping is further enhanced even in the case of thin wires with a diameter less than or equal to 18 μm, and it is advantages for fine pitch connection with a diameter less than or equal to 40 μm.

If a bonding wire with a multilayer structure has a composition in which greater than or equal to 50% of crystalline orientations <hkl> in the lengthwise direction at a crystal face of a surface of the skin layer is <111> and a ratio (an aspect ratio of crystal grain diameters) of an average size of a crystal grain in the surface of the skin layer in the lengthwise direction relative to an average size thereof in the circumferential direction is greater than or equal to three, the linearity of the bonding wire having undergone loop formation can be improved. When the bonding wire is pushed out from the aperture in the leading end of the capillary and is pushed back therein to form a loop, a curl failure as the bonding wire falls down and is bent because of friction with the internal wall of the capillary, and a bonding failure as the bonding wire grows down occur, resulting in reduction of a yield. In order to suppress such failures and to improve the loop linearity, the inventors of the present invention found that it is effective if the aspect ratio of the crystal grain at the surface of the skin layer is increased. If the aspect ratio is increased, crystal grains long in the wire lengthwise direction form fibrous texture, and it is advantageous for reducing a residual strain in the bonding wire at the time of loop formation and deformation dispersion thereof. If the aspect ratio is greater than or equal to three, an effect of improving the loop linearity can be sufficiently accomplished. Preferably, if the aspect ratio is greater than or equal to five, a good loop linearity can be acquired at a long span in which a wire diameter is less than or equal to 25 μm and a wire length is longer than or equal to 5 mm. More preferably, if the aspect ratio is greater than or equal to ten, an effect of improving the loop linearity at a super long span in which a wire length is greater than or equal to 7 mm can be enhanced.

The face-centered cubic metal which is a main constituent of the skin layer is a metal different from the electrically-conductive metal which is a main constituent of the core member, and it is desirable that such a metal should have an effect of improving the bonding property of the bonding wire and be effective for suppressing any oxidization of the bonding wire. More specifically, Pd, Pt, Ru, Rh, and Ag are candidates of such a metal, and at least one kind of followings: Pd; Pt; Ru; and Ag is desirable from the standpoint of practical utility and cost performance. Note that a main constituent in the embodiment means an element having a concentration greater than or equal to 50 mol %. Pd has advantages that adhesiveness to an encapsulation resin and bonding property to an electrode are sufficient and quality management is easy. Pt makes stabilization of a ball shape relatively easy. Ru is a hard metal, facilitates formation of a dense film, and has a relatively inexpensive material cost. Rh has a good oxidization resistance and the like, but has an expensive material cost, so that a future examination thereof like thinning is anticipated. Ag is a soft material, makes suppression of any formation of flaws, formed by drawing of a wire formed with the skin layer beforehand, relatively easy, and has an inexpensive material cost, so that it is appropriate for cost-emphasized semiconductors.

That is, it is preferable that the skin layer should be a pure metal mainly composed of at least one kind of followings: Pd; Pt; and Ru, or, should be an alloy mainly composed of such an electrically-conductive metal. If the skin layer is a pure metal, it is advantageous that improvement of oxidization resistance and bonding property is relatively easy, and if the skin layer is an alloy, there is an advantage of increasing the tensile strength and the elastic modulus, resulting in suppression of any wire deformation at the time of resin encapsulation. Note that a pure metal in the embodiment means that a layer having a concentration greater than or equal to 99 mol % is contained in a part of the skin layer, or the average concentration of the skin layer other than a diffusion layer is greater than or equal to 80 mol %. An alloy means one containing at least one kind of followings: Pd; Pt; and Ru at a concentration greater than or equal to 50 mol %.

Cu, Au, and Ag are candidates for the electrically-conductive metal of the core member, and from the standpoint of practical utility, it is desirable that the core member should be mainly composed of at least one kind of followings: Cu; and Au. Cu has an inexpensive material cost, has a good electrical conductivity, and relatively-good handleability such that ball formation is easy if sprayed with a shield gas at the time of ball formation. Au has a high oxidization resistance, does not require a shield gas at the time of ball formation, has a good deformation behavior at the time of bonding, and is easy to ensure the bonding property. Ag has a good conductivity, but is slightly difficult to do wire drawing, so that it is necessary to make the manufacturing technique appropriate. Conversely, Cu and Au have an advantage that those are time-proven materials for the monolayer bonding wires.

If the core member is formed of an alloy mainly composed of an electrically-conductive metal, there is an advantage in some cases for thinning or improvement of the bonding reliability because the wire strength is increased. In the case of the Cu alloy, if such an alloy contains at least one kind of followings: B; Pd; Bi; and P within a range from 5 to 300 ppm, the tensile strength of the bonding wire and the elastic modulus thereof increase, resulting in accomplishment of an effect of improving the linearity at a long span up to 5-mm or so. In order to enhance such additive action, the inventors of the present invention verified that a good effect which is insufficient in the case of the Cu monolayer wires can be accomplished if it is applied to the multilayer wires having the core member mainly composed of Cu. That is, if the core member is formed of a Cu alloy containing B, Pd, Bi, and P therein within a range from 5 to 300 ppm, the skin layer is mainly composed of at least one kind of followings: Pd; Pt; and Ru, and the percentage of the <111> orientations in the crystalline orientations <hkl> in the lengthwise direction at the crystal face of the surface of the skin layer is greater than or equal to 50%, an effect of improving the linearity at a long span is further enhanced. This is because the linearity may be improved due to the synergic effect by the skin layer that the crystalline orientations are controlled and the core member containing the alloy elements.

If a bonding wire with a multilayer structure employs a composition in which the percentage of the <111> orientations in the crystalline orientations <hkl> in the lengthwise direction at the crystal face of the surface of the skin layer is greater than or equal to 50%, the main constituent of the skin layer is Pd or Ag, the main constituent of the core member is Cu, and the core member contains Pd at a concentration within a range from 5 to 10000 ppm, it is easy to comprehensively satisfy suppression of any formation of flaws and scraping and stabilization of a loop shape and a loop height or stabilization of compressive bonding shape of a ball bonded part. In a thermal treatment process in manufacturing of wires, because of a synergic action of making a change in the Pd concentration uniform and moderate as Pd in the core member and Pd, Ag in the skin layer interdiffuse one another in the vicinity of the interface between the core member and the skin layer, a good action of reducing peeling and scraping of the proximity of a top surface of a loop and an action of reducing dispersion in shapes, such as fall-down of a loop and bending thereof, can be accomplished. Such concentration change is effective to not only a whole wire but also a neck part where heat at the time of ball melting affects, thus effective to stabilize loop heights. According to the combination of the Cu core member and the Pd skin layer, mixing of Cu with Pd, Ag may become nonuniform when a ball is melted and a ball shape may become abnormal, but as the core member contains Pd, an effect of causing the shape of a ball bonded part to be a true circle is enhanced. Regarding the Pd concentration contained in the core member, if it is greater than or equal to 5 ppm, the foregoing effects are verified, and preferably, if it is greater than or equal to 200 ppm, such an effect of improvement becomes more remarkable. Regarding the uppermost limit of the Pd concentration, if it is less than or equal to 10000 ppm, any chip damage due to hardening of a ball can be suppressed, and preferably, if it is less than or equal to 8000 ppm, an effect of suppressing any chip damage is further enhanced, and it is advantageous for fine pitch connection.

In the case of an Au alloy, if more than or equal to one kind of Be, Ca, Ni, Pd, and Pt is contained at a concentration within a range from 5 to 8000 ppm, the same effects can be accomplished and it becomes easy to ensure a good linearity. That is, it is desirable that the core member should be formed of an Au alloy containing more than or equal to one kind of Be, Ca, Ni, Pd, and Pt at a concentration within a range from 5 to 8000 ppm, the skin layer should be mainly composed of at least one kind of followings: Pd; Pt; and Ru, and the percentage of the <111> orientations in the crystalline orientations <hkl> in the lengthwise direction at the crystal face of the surface of the skin layer should be greater than or equal to 50%.

According to the structure of the bonding wires with a multilayer structure, if an intermediate metal layer composed of different constituent from the main constituent of the skin layer and that of the core member is present between the skin layer and the core member, it becomes more effective to control the crystalline orientations of the skin layer. This is because crystalline orientations in a base layer may affect formation of the skin layer, and it is relatively easy to control crystalline orientations in the intermediate metal layer formed on the core member rather than to control crystalline orientations of the core member. More specifically, the same face-centered cubic metal as the metal of the skin layer is desirable for the intermediate metal layer. In particular, it is more preferable that the lattice constant of the metal of the intermediate metal layer should be similar to the lattice constant of the metal of the skin layer.

That is, it is desirable that a bonding wire with a multilayer structure should have an intermediate metal layer which is composed of a different constituent from the main constituent of the skin layer and that of the core member and which is present between the skin layer and the core member. As an effect of adding the intermediate metal layer, a peel strength which is a barometer of the bonding strength of a wedge bonded part can be improved as the adhesiveness between the skin layer and the core member is improved. A simple technique of measuring a pull strength in the vicinity of a wedge bonded part can be used as a substitute for measurement of the peel strength. Accordingly, the peel strength can be increased by causing the intermediate metal layer to intervene. The constituent of the intermediate metal layer should be selected based on the combination of the constituent of the skin layer and that of the core member, the foregoing metal constituents are preferable, and in particular, Au, Pd, or Pt is more preferable. More preferably, when the combination of the main constituents of the skin layer and the core member, respectively, is Pd/Cu, if the main constituent of the intermediate metal layer is Au, it is advantageous for controlling of the crystalline orientations of the skin layer, and the respective adhesiveness at interfaces among skin layer/intermediate layer/core member are relatively good. Moreover, when the combination of the main constituents of the skin layer and the core member, respectively, is Pd/Au, if the main constituent of the intermediate metal layer is Pt, it is advantageous for controlling of the crystalline orientations and for making the composition of the skin layer and the film thickness thereof uniform.

When the thickness of the skin layer is within a range from 0.005 to 0.2 μm, it is advantageous for controlling of the foregoing crystalline orientations of the skin layer, and it facilitates comprehensive satisfaction of requisite characteristics, such as the bonding property and the loop controllability. If the thickness is greater than or equal to 0.005 μm, a sufficient effect of controlling the crystalline orientations of the skin layer can be accomplished, and if it exceeds 0.2 μm, hardening of a ball because of alloying becomes remarkable, and a chip damage like cracking may be caused at the time of bonding.

Preferably, if the thickness of the skin layer is within a range from 0.01 to 0.15 μm, it becomes possible to stably form a loop with a desired loop shape without reducing a speed in a complex loop control. More preferably, if it is within a range from 0.020 to 0.1 μm, this facilitates acquisition of a stable film quality such that the processing efficiency of a film formation process can be increased while packaging the usability of the bonding wire.

If the thickness of the intermediate metal layer is within a range from 0.005 to 0.2 μm, this facilitates controlling of the crystalline orientations of the skin layer, the adhesiveness of the interface with the core member is improved, and it becomes possible to cope with complex loop control. Preferably, if it is within a range from 0.01 to 0.1 μm, this facilitates ensuring of the uniformity of the film thickness and the reproducibility thereof.

An interface between the skin layer and the core member is a part where a total of the detected concentration of the electrically-conductive metal of the skin layer is 50 mol %. Accordingly, the skin layer of the present invention is a surface from a part where the total of the detected concentration of the electrically-conductive metal of the skin layer is 50 mol %, i.e., is a part where the total of the detected concentration of the electrically-conductive metal of the skin layer is greater than or equal to 50 mol %.

It is desirable that the crystalline orientation of the present invention should include ones that an angular difference of the crystalline orientation relative to the lengthwise direction of the bonding wire is within 15 degree. In general, when a crystalline orientation in a particular direction is focused, individual crystals have angular differences in some measure, and a slight angular difference is caused depending on experimental methods including how to prepare a sample and how to measure the crystalline orientations. When the angular difference is within 15 degree, characteristics of individual crystalline orientations are possessed and the degree of their influences to various characteristics of the bonding wire can be effectively utilized.

Regarding the texture of a surface of a thin wire with a wire diameter of μm or so, it is not well known so far, and there are few reports for, in particular, the texture of an outermost surface of thin multilayer wires. In order to precisely measure the texture of a bonding wire which is relatively soft and is a metal wire with a small diameter, an advanced measurement technique is requisite.

Regarding how to measure a texture, an electron back scattering pattern (hereinafter, EBSP) technique recently developed can be used because it is advantageous for narrowing down a measurement-target area into a tiny part, and for acquiring information on an outermost surface only. According to measurement of a texture through the EBSP technique, a texture of a surface or a cross section of a bonding wire can be measured precisely with a sufficient reproducibility even though the bonding wire is a thin object. According to this measurement technique, it is possible to measure distributions of crystalline orientations of tiny crystal grains in a submicron order and those of crystalline orientations of a wire surface highly precisely with a good reproducibility regarding a fine texture of the bonding wire.

According to the EBSP technique, in general, when concavities and convexities of a sample and a curved face thereof are large, it is difficult to measure crystalline orientations highly precisely. However, if measurement conditions are made appropriate, highly-precise measurement and analysis become possible. More specifically, a bonding wire is fixed on a plane straightly, and a flat part in the vicinity of the center of the bonding wire is measured through the EBSP technique.

Regarding a measurement-target area, when a size thereof in the circumferential direction is less than or equal to 50% of the wire diameter with the center in the lengthwise direction being an axis, and a size in the lengthwise direction is less than or equal to 100 μm, measurement efficiency can be enhanced in addition to the precision. Preferably, if the size in the circumferential direction is less than or equal to 40% of the wire diameter and the size in the lengthwise direction is less than or equal to 40 μm, a time required for measurement can be reduced, resulting in further enhancement of the measurement efficiency.

In order to carry out highly-precise measurement through the EBSP technique, because an area which can be measured at a time is limited, it is desirable that more than or equal to three areas should be measured and average information in consideration of dispersion should be obtained. It is preferable to select measurement-target areas in such a way that measurement-target areas do not overlap so that different areas in the circumferential direction can be measured.

For example, when a bonding wire with a wire diameter of 25 μm is subjected to measurement, the bonding wire fixed on a plane so as not to change a wire direction as much as possible is used, a measurement-target area at a time is set to be a size of 8 μm in the circumferential direction around the wire axis and a size of 30 μm in the lengthwise direction, three areas separately from one another by greater than or equal to 1 mm are measured, and then average information on crystalline orientations in the wire surface can be acquired. However, the measurement-target areas, and how to select the measurement-target area are not limited to the foregoing ones, and it is desirable to make those appropriate in consideration of a measurement device, a wire condition and the like.

When the crystalline orientations of the core member are subjected to measurement, measurement can be carried out through both of a vertical cross section in the lengthwise direction of the wire or a parallel cross section in the vicinity of the center of the wire parallel to the lengthwise direction. Preferably, a polished surface to be acquired can be easily obtained through the vertical cross section. When a cross section is formed by mechanical polishing, it is desirable to remove a skin by etching in order to reduce a residual strain on the polished surface.

In analysis of the measurement result through the DBSP technique, when an analysis software installed in the device is used, the foregoing area ratio of the area of a crystal grain in each orientation relative to the measured area of the wire surface or a ratio of each crystalline orientation with a total area of crystal grains or a total area where crystalline orientations can be identified in the measured areas being as a parent population can be calculated. A minimum unit for calculating an area of a crystalline orientation may be a crystal grain or a tiny area in a part of a crystal grain. Regarding a size of the crystal grain, an average size or the like can be calculated in the lengthwise direction and in the circumferential direction.

In manufacturing the bonding wire of the present invention, a step of forming the skin layer on the surface of the core member, and a working/thermal treatment step of controlling the structures of the skin layer, the diffusion layer, and the core member, and the like, respectively, are requisite.

Examples of how to form the skin layer on the surface of the core member are plating, vapor deposition, melting, and the like. In plating, electrolytic plating and nonelectrolytic plating can be applied separately. Electrolytic plating has a fast plating speed, and can acquire a good adhesiveness with a base. Electrolytic plating can be one-time process, but can be separated into thin film plating so-called flash plating, and actual plating for making a film grown thereafter, and those can be carried out through plural steps, thereby making the film quality stable. A solution used for nonelectrolytic plating can be classified into a substitutional type and a reduced type, when a film to be formed is thin, merely substitutional plating is sufficient, but when a film to be formed is thick, it is effective to perform reduced plating after substitutional plating step by step. Nonelectrolytic technique needs a simple device, is easy to carry out, but requires a more time than electrolytic technique.

In vapor deposition, physical adsorption, such as sputtering, ion plating or vacuum deposition, or chemical adsorption like plasma CVD can be applied. Those are all dry systems, do not need rinsing after film formation, and thus having no possibility of surface contamination by rinsing.

Regarding at a step of performing plating or vapor deposition, both of a technique of forming a film of an electrically-conductive metal at a target wire diameter and a technique of once forming a film on the core member with a large diameter and of drawing such wire several times to acquire a target wire diameter are effective. In the case of film formation of the former technique at a final diameter, manufacturing, quality management and the like are easy, and in the case of the latter combination of film formation and wire drawing, it is advantageous for improvement of the adhesiveness between the film and the core member. Specific examples of individual formation techniques are a technique of forming a film on a thin wire with a target wire diameter while successively sweeping the wire in an electrolytic plating solution, and a technique of forming a film by soaking a thick wire in an electrolytic or nonelectrolytic plating solution and of drawing the wire to acquire a final wire diameter.

The final plating technique of forming the skin layer at the final wire diameter requires only a thermal treatment process after film formation. Moreover, the thick-diameter plating technique of forming a film on a thick core member requires a combination of a working process of acquiring a target wire diameter and a thermal treatment process.

In a working process after the skin layer is formed, rolling, swaging, dice wire drawing and the like are applied selectively and separately in accordance with purposes. Controlling a work texture, dislocation, defects of a crystalline interface and the like based on a work speed, a pressurization rate, a reduction of dice area and the like affects the texture of the skin layer and the adhesiveness thereof.

If a wire is simply subjected to film formation, working and heating, crystalline orientations in a texture at the surface of the skin layer and at the interior thereof cannot be controlled. When a processing-strain elimination annealing at a final wire diameter which is applied in normal wire manufacturing processes is directly applied, loop control may become unstable because of reduction of the adhesiveness between the skin layer and the core member, and controlling of the uniformity of the skin layer in the wire lengthwise direction, the distribution of the skin layer and that of a diffusion layer at a wire cross section may become difficult. Accordingly, it becomes possible to stably control the texture of the skin layer by comprehensively and appropriately combining working conditions, such as a formation condition of the skin layer, reduction of area in a wire drawing process and a speed, a timing of a thermal treatment process, a temperature, a speed, a time and the like.

In processes of rolling and drawing of wires, a work texture is formed and in a thermal treatment process, restoration and recrystallization progress so that a recrystallization texture is formed, and those textures are mutually associated with each other to set a final texture of the skin layer and crystalline orientations thereof. In order to direct the crystalline orientations of the skin layer to the <111> orientations, utilization of a work texture is more effective. As the process condition of wire drawing after formation of a film is made appropriate, the orientation percentage to the <111> orientations can be increased. The orientation percentage to the <111> orientations by wire drawing varies depending on wire conditions like a composition before working, but in order to set the <111> orientation percentage of the skin layer to be greater than or equal to 50%, for example, it is effective to increase the work rate greater than or equal to 80%. Preferably, when the work rate is set to be greater than or equal to 95%, an effect of increasing the <111> orientation percentage across the whole bonding wire can be enhanced.

In a thermal treatment process, it is effective to perform thermal treatment once or plural times. The thermal treatment process can be classified into annealing right after film formation, annealing during a process, and a finish annealing at a final wire diameter, and it is important to apply those annealing selectively and separately. Depending on in which process stage a thermal treatment is performed, the final skin layer, diffusion behavior at an interface between the skin layer and the core member, and the like are changed. As an example, if process annealing is performed during a process after plating, a wire is drawn, and finish annealing is performed at a final wire diameter to manufacture a bonding wire, it is advantageous for improvement of the adhesiveness as a diffusion layer is formed at an interface between the skin layer and the core member in comparison with a process without intermediate annealing.

Regarding a method of thermal treatment, as thermal treatment is performed while successively drawing a wire and a temperature gradient is set in a furnace, not setting a furnace temperature to be constant which is a general thermal treatment, it becomes easy to do mass production of the bonding wire of the present invention having the skin layer and the core member. As specific examples, a method of locally introducing a temperature gradient and a method of changing a temperature in a furnace can be applied. When it is desirable to suppress any surface oxidization of the bonding wire, it is effective to perform heating while causing inactive gases, such as N2 and Ar, to flow inside the furnace.

In a melting method, a casting technique of melting either the skin layer or the core member is applied, and as a wire is drawn at a thick diameter of 10 to 100 mm or so after the skin layer and the core member are connected together, there are advantages such that the productivity becomes good, designing of the alloy constituent of the skin layer is easy in comparison with plating and vapor deposition, and improvement of characteristics, such as the strength and the bonding property, can be easily accomplished. Specific process can be divided into a method of casting a melted electrically-conductive metal around the core member manufactured beforehand to form the skin layer and a method of using a hollow cylinder of an electrically-conductive metal manufactured beforehand and of casting a melted metal in the hollow part to form the core member. The latter method of casting the core member in the hollow cylinder is preferable because it facilitates stable formation of the concentration gradient or the like of the main constituent of the core member in the skin layer. If a tiny amount of copper is contained in the skin layer manufactured beforehand, controlling of the copper concentration at a surface of the skin layer becomes easy. It is possible to omit a thermal treatment for diffusing Cu in the skin layer in the melting method, but if a thermal treatment is performed for adjusting the distributions of Cu in the skin layer, further characteristic improvement can be expected.

By using such a melted metal, it becomes possible to manufacture at least either one of the core member and the skin layer by successive casting. According to such successive casting, processes are simplified in comparison with the foregoing casting method, and a wire diameter can be thinned, thereby improving the productivity.

When bonding is performed using a multilayer copper wire having the core member mainly composed of copper, a shield gas is requisite for forming a ball, and an $N_2$ gas containing $H_2$ at a concentration within a range from 1 to 10% or a pure $N_2$ gas is used. A mixed gas represented by 5% $H_2+N_2$ is recommended for the conventional monolayer copper wires. In contrast, in the case of the multilayer copper wires, a good bonding property can be acquired even if an inexpensive pure $N_2$ gas is used, so that a running cost can be reduced in comparison with the case in which 5% $H_2+N_2$ that is a standard gas is used. It is desirable that the purity of the $N_2$ gas should be greater than or equal to 99.95%. That is, a bonding method of causing arc discharging while spraying the N2 gas having the purity of greater than or equal to 99.95% to the leading end of a wire or thereabout to form a ball, and of bonding the ball is desirable.

Moreover, if a diffusion layer is formed between the skin layer and the core member, the adhesiveness therebetween can be improved. The diffusion layer is an area formed as the main constituent of the core member and that of the skin layer interdiffuse, and has concentration gradients of such main constituents. By forming the diffusion layer, the adhesiveness between the skin layer and the core member can be improved, peeling of the skin layer at the time of loop control and bonding can be suppressed, and by setting the concentration gradient, in comparison with a case in which the electrically-conductive metal has a uniform concentration across the skin layer, wire deformation can be stabilized in a control at the time of formation of a loop which is likely to be affected by complex plastic deformation. Moreover, by increasing the percentage of the <111> orientations of the surface of the skin layer to be greater than or equal to 50%, it is verified that an effect of suppressing any formation of flaws and scraping is further improved if there is the diffusion layer having the concentration gradient. Regarding the concentration gradient in the diffusion layer, it is desirable that the level of concentration change in the depth direction should be greater than or equal to 10 mol % per 1 μm. Preferably, if it is greater than or equal to 5 mol % per 0.1 μm, an effect of mutually utilizing physicality of the skin layer and that of the core member different from each other can be anticipated without deteriorating those. It is preferable that the thickness of the diffusion layer should be within a range from 0.002 to 0.2 μm. This is because if the thickness of the diffusion layer is less than 0.002 μm, the foregoing effect is insufficient and is difficult to identify through analysis, and if it exceeds 0.2 μm, there is an undesirable effect to the texture of the skin layer which makes stable formation of the crystalline orientations difficult. Application of a thermal treatment is effective to control the diffusion layer. As explained above, by controlling the degree of progression of diffusion through a combination of a thermal treatment and working, it becomes possible to form the desired diffusion layer uniformly in the circumferential direction of a wire or the lengthwise direction thereof.

Regarding the concentration analysis of the skin layer, and that of the core member and the like, a technique of performing analysis while digging down in the depth direction from the surface of the bonding wire by sputtering or the like, or a method of performing line analysis or point analysis at a wire cross section is effective. The former is effective when the skin layer is thin, but takes a too much time for measurement if the skin layer is thick. The latter cross-sectional analysis is effective when the skin layer is thick, and has an advantage that checking of the concentration distribution across the entire cross section and of the reproducibility at several portions is relatively easy, but the precision thereof decreases when the skin layer is thin. It is possible to measure the concentration by polishing a bonding wire obliquely and by increasing the thickness of the diffusion layer. The line analysis is relatively easy for a cross section, but when it is desirable to improve the precision of analysis, it is effective to narrow analysis intervals of line analysis, and to perform point analysis while focusing on only an area which is desirable to observe in the vicinity of an interface. As an analysis device for such concentration analysis, an electron probe micro analyzer (EPMA) technique, an energy dispersive x-ray spectroscopy (EDX) technique, an auger electron spectroscopy (AES) technique, a transmission electron microscope (TEM) and the like can be applied. In particular, according to the AES technique, because the spatial resolution is high, it is effective for concentration analysis of a thin area of the outermost surface. Moreover, for checking of an average composition or the like, it is possible to dissolve a bonding wire from the outermost surface step by step in an acid, and to acquire the composition of the dissolved part from a concentration contained in the solution. According to the present invention, it is not necessary that the concentration acquired through all of the foregoing analysis techniques satisfies the stipulated range of the present invention, but the effect of the present invention can be accomplished if the concentration acquired through any one of the foregoing analysis techniques satisfies the stipulated range of the present invention.

Examples

An explanation will be given of examples of the present invention.

As raw materials for bonding wires, Cu, Au, and Ag which were to be used for a core member and which had a high purity of greater than or equal to approximately 99.99% by weight were prepared, and Au, Pt, Pd, Ru, and Rh which had a purity greater than or equal to 99.99% by weight and which were to be used for a skin layer or an intermediate metal layer were also prepared.

Wires thinned to a certain wire diameter were used as a core member, and electrolytic plating, nonelectrolytic plating, vapor deposition, melting and the like were performed thereon and a thermal treatment was performed to form a different metal layer on a wire surface of the core member. A method of forming a skin layer at a final wire diameter and a method of forming a skin layer at a certain wire diameter and of thinning a wire to a final wire diameter by wire drawing were adopted. Commercially-available plating solutions for a semiconductor application were prepared for electrolytic plating and nonelectrolytic plating, and sputtering was applied as vapor deposition. Wires having a diameter of approximately 15 to 1500 µm were prepared beforehand, the wire surface thereof was coated by vapor deposition, plating and the like, the wires were drawn to 15 to 50 µm which were a final wire diameter, and a work strain was removed and thermal treatment was performed in such a way that the elongation would be within a range from 5 to 15% at last. Dice drawing was performed up to a wire diameter of 25 to 200 µm as needed, diffusion thermal treatment was performed, and then wire drawing was performed again. The reduction of area of the drawing dice was set within a range from 5 to 15% per one dice, and those dices were combined to adjust introduction of a work strain or the like on a wire surface. The wire drawing rate was adjusted between 20 to 500 m/min.

In a case in which the melting method was applied, a method of casting a melted metal around a core member manufactured beforehand and a method of casting a melted metal in the center of a hollow cylinder manufactured beforehand were applied. Thereafter, processes, such as forging, rolling, and dice drawing, and thermal treatment were performed to manufacture a wire.

Regarding thermal treatment for the wires of the present invention, wires were heated while successively drawn. A scheme of introducing a temperature gradient locally and a scheme of changing a temperature in a furnace were adopted. For example, a thermal treatment furnace which was modified so as to be able to control and divide a temperature inside a furnace into three stages was used. As examples of a temperature distribution, distributions of a high temperature, a middle temperature, and a low temperature, or a middle temperature, a high temperature, and a low temperature were acquired from a wire entrance toward a wire exit, and respective heating times were also managed. In addition to the temperature distribution, a wire sweeping speed or the like was also made appropriate. In an atmosphere of the thermal treatment, inactive gases, such as $N_2$ and Ar, were used to suppress any oxidization. A gas flow rate was adjusted within a range from 0.0002 to 0.004 $m^3$/min, and was used for controlling a temperature inside the furnace. A timing of performing thermal treatment was separated for a case in which a skin layer was formed after thermal treatment was applied to a wire having undergone drawing, and for a case in which thermal treatment was applied once or greater than or equal to twice before a process, during a process, or right after the skin layer was formed.

Regarding a work level by rolling and wire drawing after the skin layer was formed, it can be sorted out by an accumulated work rate calculated based on an area ratio between a wire at the time of film formation and a final wire diameter. When the work rate (%) was less than 30%, it is indicated in a table by a letter R1, when the work rate was greater than or equal to 30% but less than 70%, it is indicated in the table by a letter R2, when the work rate was greater than or equal to 70% but less than 95%, it is indicated in the table by a letter R3, and when the work rate was greater than or equal to 95%, it is indicated in the table by a letter R4.

In order to control a surface texture of the skin layer, it is necessary to make a material factor, such as a material quality, a composition, a thickness or the like, and a process factor, such as a film formation condition, a process and thermal treatment condition, or the like, appropriate. In the examples, as a scheme of increasing the <111> ratio in the lengthwise direction at a surface of the skin layer, it was effective to increase the work rate, to make an initial film thin, and to lower the temperature of a thermal treatment. As an example, when the work rate is R2 to R4, it is relatively easy to increase the <111> ratio. In contrast, in a comparative example, it was effective to decrease the work rate and to perform thermal treatment at a high temperature or for a long time in order to reduce the <111> ratio.

Regarding observation of a texture of a wire surface, crystalline orientations were measured through the EBSP technique in a certain area of the skin layer of a bonding wire. Regarding preparation of measurement samples, three to five bonding wires were fixed on a plane in such a way that wire directions differed from one another as much as possible. Regarding an observed area, a rectangular area including a wire axis was set as a measurement-target area at a time having a size of 5 to 10 μm in the circumferential direction and of 10 to 50 μm in the lengthwise direction. Three to ten measurement-target areas were selected in such a manner as to be spaced apart from one another by greater than or equal to 0.5 mm. An interval of measurement points was set to 0.01 to 0.2 μm.

In observation of a texture of the core member, a sample that a cross section of a bonding wire was polished and a work strain at a surface was reduced by chemical etching was used, and crystalline orientations were measured through the EBSP technique. Regarding the cross section, a cross section vertical to the wire lengthwise direction was mainly subjected to measurement, but a cross section parallel to the wire lengthwise direction and running through a central axis was also measured in consideration of a sample condition, a reproducibility and the like as needed.

An exclusive software (OIM analysis or the like made by TSL) was used for analysis of EBSP measurement data. Crystalline orientations at a measured area were analyzed, and the percentage of crystal grains in the <111> and <100> orientations in the measured orientations was acquired. An orientation was set with reference to the lengthwise direction of a bonding wire, and ones having an angular difference within 15 degree in individual crystalline orientations were also considered for percentage acquisition. Regarding a calculation method of the percentage of the crystal grains, two kinds of percentages were acquired: one (hereinafter, area ratio) in each orientation calculated with a whole area of a measured area being as a parent population; and the other (hereinafter, orientation ratio) in each orientation calculated with an area of only crystalline orientations which were able to identify being as a parent population with reference to a certain level of reliability in a measured area. In the process of the latter one of acquiring an orientation ratio, calculation was carried out while excluding a part where it was not possible to measure crystalline orientations or a part where it was possible to measure crystalline orientations but the level of reliability for orientation analysis was low. Regarding the level of reliability, parameters may be prepared in analysis softwares, and it is desirable to select a criterion in accordance with a condition of a sample, a purpose of analysis and the like using plural kinds of parameters, such as Confidential Index (CI value), and Image Quality (IQ value).

Depth analysis by AES was applied for measurement of a film thickness at a wire surface, and surface analysis and line analysis by AES, EPMA or the like were performed for observation of distributions of elements like concentration of crystal grain interfaces. In the depth analysis by AES, measurement was performed in the depth direction while performing sputtering with Ar ions, and a depth unit was displayed in $SiO_2$ conversion. The concentration of electrically-conductive metals in a bonding wire was measured through ICP analysis, ICP mass analysis or the like.

For connection of bonding wires, a commercially-available automatic wire bonder was used to perform ball/wedge bonding. A ball was formed at a leading end of a wire by arc discharging, and bonded to an electrode film on a silicon substrate, while another end of the wire was subjected to wedge bonding on a lead terminal. A pure $N_2$ gas was mainly used as a shield gas used for suppressing any oxidization at the time of ball formation. A gas flow rate was adjusted within a range from 0.001 to 0.01 $m^3$/min.

An Al-alloy film (Al-1% Si-0.5% Cu film, Al-0.5% Cu film) which was a material of an electrode on a silicon substrate and which had a thickness of 1 μm was used as a bonding partner. Conversely, as a partner for wedge bonding, a lead frame having an Ag plating (thickness: 2 to 4 μm) on a surface thereof was used. Note that regarding the bonding property to an Au/Ni/Cu electrode on a BGA substrate, it was verified that the same effect as that of the lead frame can be acquired using some of the wire samples.

Regarding evaluation for flaws, scraping and the like on a wire surface, those were checked through observation of the exterior appearance of a bonded loop. Evaluation could be made including any effects prior to loop formation, such as flaws, scraping and the like caused in a wire manufacturing process. A wire diameter was set to 25 μm. Wire lengths were set to be two kinds: a general-purpose span of 2 mm; and a long span of 5 mm, trapezoidal loops were formed with a target height being set to 100 to 250 μm, and 1000 bonding wires for each kind were observed through a projector. Observation for flaws was made around the external side of a loops, and, for scraping, made around a neck part in the vicinity of a ball bonded part having a higher occurrence frequency, and flaws having a size of greater than or equal to 10 μm were counted. For low-loop evaluation, low loops having a target height set to approximately 65 μm were formed, and occurrence of flaws and scraping were observed through the same fashion. In general, the longer the wire length is, or the lower the loop height is, the more the frequency that a wire surface is scratched increases, so that evaluation becomes harsh. When there were greater than or equal to four scraping and flaws were noticeable, it was determined that a problem was present and it is indicated in the table by a cross mark in the table, when the number of scarping was one to three but there were lots of flaws and a negative effect like clogging of a capillary was concerned, it was determined that improvement was necessary and it is indicated in the table by a triangular mark, when the number of scraping was one to three and there was no big flaw acknowledged as a problem, it was determined that a wire surface was relatively good and it is indicated in the table by a circular mark, and when there was no scraping and no noticeable flaw, it was determined as stable and it is indicated in the table by a double circular mark. Determination of flaws and scraping might be affected by a personal judgment by an observer in some levels, so that evaluation was made by greater than or equal to two observers, and ranking was made with average information.

For evaluation of flaws and scraping on a wire surface in the case of a thin wire, wires with two kinds of wire diameters: 22 μm; and 18 μm were prepared. A wire length was set to 2 mm, and trapezoidal loops having a target height set to 70 to 200 μm were formed, and 1000 bonding wires for each kind were observed through a projector. The same criteria were adopted for evaluation of flaws and scraping.

In order to evaluate the linearity of a bonded loop, bonding was carried out at three kinds of wire intervals (spans): a normal span of 2 mm; a long span of 5 mm; and a super long span of 7 mm. A wire diameter was set to 25 μm. Thirty bonding wires were observed from above through a projector, and a displacement at a part where a bonding wire was spaced apart at a maximum relative to a straight line interconnecting a ball bonded part and a wedge bonded part together was measured as an amount of curvature. When an average of such amount of curvature was less than a wire diameter of one wire, it was determined as good and it is indicated in the table by a double circular mark, when such an average was greater than or equal to wire diameters of two wires, it was determined as bad, and it is indicated in the table by a triangular mark, and when such an average was therebetween, it would not become a problem in general, and it is indicated in the table by a circular mark.

Regarding the stability of a loop shape in a bonding process, thirty trapezoidal loops were connected at a long span with a wire length of 5 mm so as to obtain a loop height of 200 to 250 μm, and such stability was evaluated based on a standard deviation of heights. A wire diameter was set to 25 μm. An optical microscope was used for measuring heights, and measurement was carried out at two locations in the vicinity of the highest part of a loop and at the center of the loop. When the standard deviation of loop heights was greater than or equal to ½ of the wire diameter, it was determined that dispersion was large, and when such standard deviation was less than ½, it was determined that dispersion was small and good. Determination was made based on those criteria, when dispersion was small at three locations, it was determined that a loop shape was stable and it is indicated in the table by a double circular mark in the table, when the number of locations where dispersion was large was one, it was determined as relatively good and it is indicated in the table by a circular mark, when such number was two, it is indicated in the table by a triangular mark, and when dispersion was large at all of the three locations, it is indicated in the table by a cross mark.

In determination of a bonding shape of a compressively-bonded ball part, 200 bonded balls were observed, and the roundness, abnormal deformation failure, and size precision of a shape were evaluated. A wire diameter was set to 20 μm. Evaluation was made for two kinds of ball sizes: one in which a ball with a normal size that the ratio between an initial ball and a wire diameter was 1.9 to 2.2; and the other in which a ball with a smaller diameter that the ratio was 1.5 to 1.7. When the number of defective ball shapes like anisotropic or petal-like shape out of round was greater than or equal to five, it was determined as a failure and it is indicated in the table by a cross mark, when the number of defective ball shapes out of round was two to four, this case was categorized into two kinds as follow. When the number of abnormal deformation caused was greater than or equal to one, it was determined that an improvement was requisite for mass production and it is indicated in the table by a blacked triangular mark, and when there was no abnormal deformation, it was determined as usable and it is indicated in the table by a whitened triangular mark. When the number of defective ball shapes was less than or equal to one, it was determined as good and it is indicated in the table by a circular mark.

A pull test for a wedge bonded part was carried out to evaluate a peel bonding strength. A wire diameter and a span were set to 25 μm, and 2 mm, respectively. A hook grabbing a loop was moved upwardly at a location near a wedge bonded part more than ¾ of a wire length, and the breaking strength of a bonding wire was measured. The pull strength varies depending on the wire diameter of the bonding wire, a loop shape, a bonding condition and the like, a relative ratio (Rp) between the pull strength and a wire tensile strength was acquired instead of an absolute value. When Rp was greater than or equal to 20%, it was determined that the wedge bonding property was good and it is indicated in the table by a double circular mark, when greater than or equal to 15% and less than 20%, it was determined as no problem and it is indicated in the table by a circular mark, when greater than or equal to 10% and less than 15%, it was determined that a problem might occur and it is indicated in the table by a triangular mark, and when greater than or equal to 10%, there would be a problem in a mass-production process and it is indicated in the table by a cross mark.

In order to evaluate adhesiveness between the skin layer and the core member at the time of loop formation, loops were observed from above using an optical microscope, and occurrence of peeling of the skin layer was checked. Using normal loops having a wire diameter of 25 μm at a 3-mm span, 400 loops were observed. The number of peeling was subjected to comparison, when such number was zero, it was determined as good and it is indicated in the table by a circular mark, when such number was one to four, it was determined as no problem in general but improvement would become requisite in some cases, so that it is indicated in the table by a triangular mark, and when such number was greater than or equal to five, there would be a problem in a mass-production process, and it is indicated in the table by a cross mark.

In depth analysis through AES analysis, a diffusion layer having a concentration gradient between the skin layer and the core member was confirmed, and when the thickness of the diffusion layer was within a range from 0.002 to 0.2 μm, a circular mark was put on a field of "diffusion layer" in table 1.

Regarding evaluation for any chip damage, a ball was bonded onto an electrode film, the electrode film was removed by etching, and any damage to an insulation film or a silicon chip was observed using an SEM. The number of electrodes observed was 400. When there was no damage, it is indicated in the table by a circular mark, when the number of cracks was less than or equal to two, it was determined as no problem and it is indicated in the table by a triangular mark, and when the number of cracks was greater than or equal to three, it was determined as a level requiring a concern, and it is indicated in the table by a cross mark.

Table 1 and table 2 show examples of the bonding wire of the present invention and comparative examples.

TABLE 1

| | | Crystalline orientation in lengthwise direction in surface of skin layer | | | Percentage of [111] + [100] in cross section of core member (%) | Aspect ratio of crystal grain in wire surface between lengthwise direction and circumferential direction | Skin layer | | | Core member | | Diffusion layer | Intermediate metal layer | | Manufacturing method (A: nonelectrolytic B: electrolytic C: vapor deposition D: melting) | Work rate |
|---|---|---|---|---|---|---|---|---|---|---|---|---|---|---|---|---|
| | | Percentage relative to whole crystalline orientations (%) | | Area ratio of [111] orientations in wire surface area (%) | | | Main constituent | Film thickness μm | Main constituent | Additive element | mass·ppm | | Main constituent | Film thickness μm | | |
| | | [111] | [100] | [111] + [100] | | | | | | | | | | | | | |
| Example | 1 | 51 | 4 | 55 | 32 | 35 | 3.5 | Pd | 0.02 | Cu | — | — | ○ | — | — | A | R2 |
| | 2 | 60 | 12 | 72 | 33 | 43 | 5.2 | Pd | 0.04 | Cu | P | 80 | ○ | — | — | B | R2 |
| | 3 | 73 | 18 | 91 | 45 | 68 | 11.3 | Pd | 0.03 | Cu | — | — | ○ | — | — | B | R4 |
| | 4 | 82 | 5 | 87 | 57 | 32 | 22.4 | Pd | 0.07 | Cu | — | — | ○ | — | — | B | R3 |
| | 5 | 94 | 0.5 | 94.5 | 82 | 47 | 27.3 | Pd | 0.04 | Cu | — | — | ○ | — | — | A | R2 |
| | 6 | 55 | 12 | 67 | 15 | 37 | 3.8 | Pd | 0.06 | Cu | — | — | ○ | — | — | A | R2 |
| | 7 | 52 | 32 | 84 | 26 | 64 | 5.6 | Pd | 0.08 | Cu | — | — | ○ | — | — | B | R3 |
| | 8 | 63 | 19 | 82 | 28 | 15 | 7.3 | Pd | 0.03 | Cu | Pd | 250 | ○ | — | — | D | R4 |
| | 9 | 72 | 15 | 87 | 35 | 27 | 4.7 | Pd | 0.18 | Cu | B | 30 | ○ | — | — | B | R1 |
| | 10 | 58 | 25 | 83 | 37 | 65 | 1.3 | Pd | 0.007 | Cu | — | — | X | — | — | B | R4 |
| | 11 | 73 | 18 | 91 | 43 | 82 | 2.7 | Rh | 0.01 | Cu | — | — | ○ | — | — | B | R2 |
| | 12 | 52 | 23 | 75 | 35 | 42 | 3.8 | Pt | 0.04 | Cu | Zr | 20 | ○ | — | — | C | R3 |
| | 13 | 65 | 12 | 77 | 36 | 39 | 6.7 | Pt | 0.08 | Cu | — | — | ○ | — | — | A | R2 |
| | 14 | 77 | 8 | 85 | 44 | 24 | 14.0 | Pt | 0.15 | Cu | — | — | ○ | — | — | B | R4 |
| | 15 | 52 | 3 | 55 | 37 | 32 | 2.3 | Ru | 0.01 | Cu | — | — | ○ | — | — | B | R1 |
| | 16 | 65 | 23 | 88 | 48 | 48 | 8.2 | Ru | 0.1 | Cu | — | — | ○ | — | — | B | R2 |
| | 17 | 53 | 4 | 57 | 30 | 47 | 3.3 | Pd | 0.06 | Au | Ca | 30 | ○ | — | — | A | R3 |
| | 18 | 62 | 17 | 79 | 43 | 25 | 1.3 | Pd | 0.01 | Au | — | — | ○ | — | — | D | R4 |
| | 19 | 65 | 3 | 68 | 38 | 61 | 4.7 | Pd | 0.04 | Au | Be | 20 | ○ | — | — | B | R1 |
| | 20 | 78 | 10 | 88 | 53 | 72 | 8.3 | Pd | 0.18 | Au | Pd | 5000 | ○ | — | — | B | R4 |
| | 21 | 92 | 1 | 93 | 72 | 95 | 28.2 | Pt | 0.09 | Au | — | — | ○ | — | — | B | R4 |
| | 22 | 55 | 23 | 78 | 25 | 43 | 5.3 | Pt | 0.03 | Au | Ni | 50 | ○ | — | — | B | R2 |
| | 23 | 72 | 12 | 84 | 45 | 55 | 8.5 | Ru | 0.07 | Ag | — | — | ○ | — | — | B | R3 |
| | 24 | 63 | 15 | 78 | 38 | 63 | 10.2 | Pt | 0.03 | Au | — | — | ○ | — | — | B | R3 |
| | 25 | 52 | 10 | 62 | 32 | 44 | 2.4 | Pd | 0.04 | Cu | — | — | ○ | Au | 0.01 | B | R2 |
| | 26 | 88 | 4 | 92 | 46 | 50 | 12.1 | Pd | 0.16 | Cu | P | 120 | ○ | Au | 0.12 | B | R4 |
| | 27 | 62 | 13 | 75 | 30 | 38 | 7.3 | Ru | 0.06 | Au | — | — | ○ | Pd | 0.01 | B | R3 |
| | 28 | 55 | 8 | 63 | 35 | 45 | 3.3 | Pd | 0.06 | Au | — | — | ○ | Pt | 0.03 | B | R2 |
| | 29 | 73 | 15 | 88 | 63 | 72 | 12.2 | Pt | 0.15 | Au | Ca | 8 | ○ | Pd | 0.09 | B | R3 |
| | 30 | 54 | 32 | 86 | 48 | 55 | 6.1 | Ru | 0.02 | Au | — | — | ○ | Pd | 0.01 | B | R2 |
| | 31 | 68 | 18 | 86 | 43 | 13 | 6.5 | Pd | 0.1 | Au | — | — | X | — | — | B | R3 |
| | 32 | 57 | 18 | 75 | 38 | 10 | 4.3 | Pt | 0.03 | Au | — | — | ○ | — | — | B | R4 |
| | 33 | 58 | 20 | 78 | 42 | 40 | 3.7 | Pd | 0.22 | Cu | B | 10 | ○ | — | — | B | R1 |
| | 34 | 55 | 18 | 73 | 43 | 32 | 3.5 | Pd | 0.12 | Cu | Pd | 100 | ○ | — | — | B | R2 |
| | 35 | 82 | 13 | 95 | 62 | 61 | 7 | Pd | 0.08 | Cu | Pd | 700 | ○ | — | — | B | R4 |
| | 36 | 67 | 15 | 82 | 45 | 33 | 13 | Pd | 0.05 | Cu | Pd | 8000 | ○ | — | — | B | R3 |
| | 37 | 61 | 17 | 78 | 38 | 53 | 8.7 | Pd | 0.02 | Cu | Pd | 9800 | ○ | — | — | B | R2 |
| | 38 | 58 | 20 | 78 | 35 | 31 | 6.5 | Ag | 0.08 | Cu | — | — | ○ | — | — | B | R4 |
| | 39 | 65 | 18 | 83 | 43 | 51 | 4.6 | Ag | 0.02 | Cu | Pd | 2000 | ○ | — | — | B | R3 |

TABLE 1-continued

| | | Crystalline orientation in lengthwise direction in surface of skin layer | | | Percentage of [111] + [100] in cross section of core member (%) | Aspect ratio of crystal grain in wire surface between lengthwise direction and circumferential direction | Skin layer | | | Core member | | | Intermediate metal layer | | | Manufacturing method (A: nonelectrolytic B: electrolytic C: vapor D: melting) | Work rate |
|---|---|---|---|---|---|---|---|---|---|---|---|---|---|---|---|---|---|
| | | Percentage relative to whole crystalline orientations (%) | | Area ratio of [111] orientations in wire surface | | | Main constituent | Film thickness μm | | Main constituent | Additive element | mass·ppm | Diffusion layer | Main constituent | Film thickness μm | | |
| | | [111] | [100] | [111] + [100] | area (%) | | | | | | | | | | | | |
| Comparative example | 1 | 42 | 3 | 45 | 31 | 35 | 4.5 | Pt | 0.002 | Cu | — | — | X | — | — | C | R1 |
| | 2 | 31 | 5 | 36 | 8 | 25 | 1.5 | Pd | 0.003 | Cu | — | — | X | — | — | B | R1 |
| | 3 | 20 | 12 | 32 | 15 | 23 | 3.3 | Pd | 0.05 | Cu | — | — | ○ | — | — | A | R1 |
| | 4 | 18 | 25 | 43 | 26 | 40 | 6.2 | Ru | 0.02 | Cu | — | — | ○ | — | — | B | R2 |
| | 5 | 32 | 12 | 44 | 19 | 23 | 2.1 | Pd | 0.23 | Au | — | — | ○ | — | — | B | R1 |
| | 6 | 23 | 18 | 41 | 27 | 65 | 10.5 | Pt | 0.01 | Au | — | — | ○ | — | — | B | R1 |

TABLE 2

| | | Evaluation for flaw and scraping (25 μmφ) | | | Evaluation for flaw and scraping with thin wire (Span 2 mm) | | Linearity of loop (25 μmφ) | | | Loop height stability (25 μmφ) | | Ball bonding shape (20 μmφ) | | Peel bonding strength (25 μmφ, span 3 mm) | Peeling of skin layer above loop | Chip damage |
|---|---|---|---|---|---|---|---|---|---|---|---|---|---|---|---|---|
| | | Span 3 mm | Span 5 mm | Low loop | 20 μmφ | 18 μmφ | Span 3 mm | Span 5 mm | Span 7 mm | Span 3 mm | Span 5 mm | Normal ball | Small-diameter ball | | | |
| Example | 1 | ⊙ | ○ | △ | ⊙ | ○ | ⊙ | ○ | △ | ○ | △ | ⊙ | ○ | ○ | ○ | ○ |
| | 2 | ⊙ | ⊙ | ○ | ⊙ | ○ | ⊙ | ⊙ | ○ | ⊙ | ○ | ⊙ | ○ | ○ | ○ | ○ |
| | 3 | ⊙ | ⊙ | ⊙ | ⊙ | ○ | ⊙ | ⊙ | ⊙ | ⊙ | ⊙ | ⊙ | ⊙ | ○ | ○ | ○ |
| | 4 | ⊙ | ⊙ | ⊙ | ⊙ | ⊙ | ⊙ | ⊙ | ⊙ | ⊙ | ⊙ | ⊙ | ⊙ | ○ | ○ | ○ |
| | 5 | ⊙ | ⊙ | ⊙ | ⊙ | ⊙ | ⊙ | ⊙ | ⊙ | ⊙ | ⊙ | ⊙ | ⊙ | ○ | ○ | ○ |
| | 6 | ⊙ | ○ | △ | ○ | △ | ⊙ | ○ | △ | ⊙ | ○ | ⊙ | ○ | ○ | ○ | ○ |
| | 7 | ⊙ | ○ | △ | ⊙ | △ | ⊙ | ○ | ○ | ⊙ | ⊙ | ⊙ | ⊙ | ○ | ○ | ○ |
| | 8 | ⊙ | ⊙ | ○ | ⊙ | △ | ⊙ | ⊙ | △ | ⊙ | ○ | ○ | △ | ○ | ⊙ | ○ |
| | 9 | ⊙ | ⊙ | ⊙ | ⊙ | ○ | ⊙ | ⊙ | △ | ⊙ | ○ | ○ | △ | ○ | ○ | ○ |
| | 10 | ⊙ | ○ | △ | ⊙ | ○ | ○ | △ | △ | ⊙ | ○ | ⊙ | ⊙ | ○ | △ | ○ |
| | 11 | ⊙ | ⊙ | ⊙ | ⊙ | ○ | ○ | △ | △ | ⊙ | ⊙ | ⊙ | ⊙ | ○ | ○ | ○ |
| | 12 | ⊙ | ○ | △ | ⊙ | ○ | ⊙ | ⊙ | △ | ⊙ | ⊙ | ⊙ | ○ | ○ | ○ | ○ |
| | 13 | ⊙ | ⊙ | ○ | ⊙ | ○ | ⊙ | ⊙ | ⊙ | ⊙ | ○ | ⊙ | ○ | ○ | ○ | ○ |
| | 14 | ⊙ | ⊙ | ⊙ | ⊙ | ○ | ⊙ | ⊙ | ⊙ | ⊙ | ⊙ | ○ | △ | ○ | ○ | ○ |
| | 15 | ⊙ | ○ | △ | ⊙ | ○ | ○ | △ | △ | ○ | △ | ⊙ | ○ | ○ | ○ | ○ |
| | 16 | ⊙ | ⊙ | ○ | ⊙ | ○ | ⊙ | ⊙ | ⊙ | ⊙ | ⊙ | ⊙ | ○ | ○ | ○ | ○ |
| | 17 | ⊙ | ○ | △ | ⊙ | ○ | ⊙ | ⊙ | △ | ⊙ | ○ | ⊙ | ○ | ○ | ○ | ○ |
| | 18 | ⊙ | ⊙ | ○ | ⊙ | ○ | ○ | △ | △ | ⊙ | ○ | ○ | △ | ○ | ○ | ○ |
| | 19 | ⊙ | ⊙ | ○ | ⊙ | ○ | ⊙ | ⊙ | △ | ⊙ | ○ | ⊙ | ⊙ | ○ | ○ | ○ |
| | 20 | ⊙ | ⊙ | ⊙ | ⊙ | ⊙ | ⊙ | ⊙ | ○ | ⊙ | ⊙ | ⊙ | ⊙ | ○ | ○ | ○ |
| | 21 | ⊙ | ⊙ | ⊙ | ⊙ | ⊙ | ⊙ | ⊙ | ⊙ | ⊙ | ⊙ | ⊙ | ⊙ | ○ | ○ | ○ |
| | 22 | ⊙ | ○ | △ | ○ | △ | ⊙ | ⊙ | ○ | ⊙ | ○ | ⊙ | ○ | ○ | ○ | ○ |
| | 23 | ⊙ | ⊙ | ⊙ | ⊙ | ○ | ⊙ | ⊙ | ○ | ⊙ | ○ | ⊙ | ⊙ | ○ | ○ | ○ |
| | 24 | ⊙ | ⊙ | ○ | ⊙ | ○ | ⊙ | ⊙ | ○ | ⊙ | ⊙ | ⊙ | ○ | ○ | ○ | ○ |
| | 25 | ⊙ | ○ | △ | ⊙ | ○ | ○ | △ | △ | ⊙ | ○ | ⊙ | ○ | ⊙ | ○ | ○ |
| | 26 | ⊙ | ⊙ | ⊙ | ⊙ | ○ | ⊙ | ⊙ | ○ | ⊙ | ⊙ | ⊙ | ⊙ | ⊙ | ○ | ○ |
| | 27 | ⊙ | ⊙ | ○ | ⊙ | ○ | ⊙ | ⊙ | ○ | ⊙ | ○ | ⊙ | ○ | ⊙ | ○ | ○ |
| | 28 | ⊙ | ○ | △ | ⊙ | ○ | ⊙ | ⊙ | ○ | ⊙ | △ | ⊙ | ○ | ⊙ | ○ | ○ |
| | 29 | ⊙ | ⊙ | ⊙ | ⊙ | ○ | ⊙ | ⊙ | ○ | ⊙ | ⊙ | ⊙ | ⊙ | ⊙ | ○ | ○ |
| | 30 | ⊙ | ○ | △ | ⊙ | ○ | ⊙ | ⊙ | ○ | ⊙ | ⊙ | ⊙ | ⊙ | ⊙ | ○ | ○ |
| | 31 | ⊙ | ⊙ | ○ | ⊙ | ○ | ⊙ | ⊙ | ○ | ⊙ | ⊙ | ▲ | ▲ | ○ | ○ | ○ |
| | 32 | ⊙ | ○ | △ | ⊙ | ○ | ⊙ | ○ | △ | ⊙ | ○ | ▲ | ▲ | ○ | △ | ○ |
| | 33 | ⊙ | ○ | △ | ⊙ | ○ | ⊙ | ○ | △ | ⊙ | ⊙ | ⊙ | ○ | ○ | ○ | △ |
| | 34 | ⊙ | ○ | △ | ⊙ | ○ | ⊙ | ⊙ | ○ | ⊙ | ⊙ | ⊙ | ⊙ | ○ | ○ | ○ |
| | 35 | ⊙ | ⊙ | ⊙ | ⊙ | ⊙ | ⊙ | ⊙ | ○ | ⊙ | ⊙ | ⊙ | ⊙ | ○ | ⊙ | ○ |
| | 36 | ⊙ | ⊙ | ○ | ⊙ | ○ | ⊙ | ⊙ | ⊙ | ⊙ | ⊙ | ⊙ | ○ | ○ | ⊙ | ○ |
| | 37 | ⊙ | ⊙ | ○ | ⊙ | ○ | ⊙ | ⊙ | ○ | ⊙ | ⊙ | ⊙ | ○ | ○ | ⊙ | △ |
| | 38 | ⊙ | ○ | △ | ⊙ | ○ | ⊙ | ⊙ | ○ | ⊙ | ○ | ⊙ | ○ | ○ | ○ | ○ |
| | 39 | ⊙ | ⊙ | ○ | ⊙ | ○ | ⊙ | ○ | △ | ⊙ | ⊙ | ⊙ | ⊙ | ○ | ⊙ | ○ |
| Comparative Example | 1 | △ | X | X | X | X | ○ | ○ | X | X | X | ○ | △ | △ | △ | ○ |
| | 2 | X | X | X | X | X | X | X | X | X | X | △ | X | △ | △ | ○ |
| | 3 | X | X | X | X | X | X | X | X | X | X | △ | X | △ | ○ | ○ |
| | 4 | X | X | X | X | X | ○ | ○ | X | X | X | ○ | △ | △ | ○ | ○ |
| | 5 | X | X | X | X | X | X | X | X | X | X | △ | X | △ | ○ | △ |
| | 6 | X | X | X | X | X | ⊙ | ○ | △ | X | X | ○ | △ | △ | ○ | ○ |

The bonding wire according to claim 1 corresponds to examples 1 to 39, the bonding wire according to claim 2 corresponds to examples 2 to 14, 16, and 18 to 39, the bonding wire according to claim 3 corresponds to examples 1 to 30, and 33 to 39, the bonding wire according to claim 4 corresponds to examples 1 to 7, 10 to 13, 15 to 17, 19 to 30, and 33 to 39, the bonding wire according to claim 5 corresponds to examples 1 to 9, 12 to 14, 16, 17, 19 to 24, and 26 to 39, the bonding wire according to claim 6 corresponds to examples 1 to 5, 9 to 21, and 23 to 39, the bonding wire according to claim 7 corresponds to examples 1 to 10, and 12 to 39, the bonding wire according to claim 8 corresponds to examples 1 to 22, and 24 to 39, the bonding wire according to claim 9 corresponds to examples 25 to 30, the bonding wire according to claim 10 corresponds to examples 1 to 32, and 34 to 39, the bonding wire according to claim 11 corresponds to examples 1 to 9, 11 to 31, and 33 to 39, the bonding wire according to claim 12 corresponds to examples 2, 8, 9, 12, 27, 33, and 34, the bonding wire according to claim 13 corresponds to examples 8, 34 to 37, and 39, and the bonding wire according to claim 14 corresponds to examples 17, 19, 20, 22, and 30. Comparative examples 1 to 6 represent results which do not satisfy the condition of claim 1.

FIG. 1 shows an example of an EBSP measurement result at a surface of the bonding wire of the example 4. An area where crystalline orientations in the wire lengthwise direction are within 15 degree of an angular difference from the <111> orientation is colored, and a crystalline interface having an angular difference greater than or equal to 15 degree is indicated by a line. The <111> area ratio in FIG. 1 is 88%.

Some of evaluation results for representative examples of individual claims will now be explained.

According to the bonding wires with a multilayer structure of the examples 1 to 39, it is verified that flaws and scraping on a wire surface are reduced because the percentage of <111> (<111> orientation percentage) in crystalline orientations in the surface of the skin layer was greater than or equal to 50% according to the present invention. In contrast, according to the comparative examples 1 to 6 relating to bonding wires with a multilayer structure in which the <111> orientation percentage in the surface of the skin layer was less than 50%, a large number of scraping and flaws are observed in normal loop formation. As preferable examples, according to the examples 2 to 5, 8, 9, 11, 13, 14, 16, 18 to 21, 23, 24, 26, 27, 29, 31, 35 to 37, and 39 in which the <111> orientation percentage in the skin layer was greater than or equal to 60%, flaws and scraping are reduced at a long span, and according to the examples 3 to 5, 9, 11, 14, 20, 21, 23, 26, 29, and 35 in which the <111> orientation percentage is greater than or equal to 70%, it is verified that failures, such as flaws and scraping, are suppressed under a sever condition with low looping.

According to the bonding wires with a multilayer structure of the examples 2 to 14, 16, 18 to 39, it is verified that dispersion in loop heights are suppressed and stabilized under a normal looping condition at a 3-mm span because the total orientation percentage of the <111> orientation and the <100> orientation in the surface of the skin layer was greater than or equal to 60% according to the present invention. Preferably, according to the examples 3 to 5, 7 to 11, 14, 16, 20, 21, 23, 26, 29, 30, 31, 35, 36, and 39 in which such orientation percentage was greater than or equal to 80%, a loop height can be stabilized at a long span of 5 mm.

According to the bonding wires with a multilayer structure of the examples 1 to 7, 10 to 13, 15 to 17, 19 to 30, and 33 to 39, it is verified that petal-like deformation failure is reduced in a condition with a normal ball size and the shape of a ball is stabilized because the total orientation percentage of the <111> orientation and the <100> orientation at the cross section of the core member was greater than or equal to 30% according to the present invention. Preferably, according to the examples 3, 7, 10, 11, 19 to 21, 23, 24, 26, 29, 30, 35, 37, and 39 in which such orientation percentage was greater than or equal to 50%, it is verified that the roundness of a ball bonded part is improved even under a sever bonding condition like small-diameter ball bonding.

According to the bonding wires with a multilayer structure of the examples 1 to 9, 12 to 14, 16, 17, 19 to 24, and 26 to 39, it is verified that the linearity of a loop is good in a normal condition at a 3-mm span because the aspect ratio between the average size of crystal grains in the surface of the skin layer in the lengthwise direction and that in the circumferential direction was greater than or equal to three according to the present invention. Preferably, according to the examples 2 to 5, 7, 8, 13, 14, 16, 20 to 24, 26, 27, 29, 30, 31, and 35 to 38 in which such aspect ratio was greater than or equal to five, it is verified that the linearity is improved under a sever bonding condition at a long span of 5 mm. More preferably, according to the examples 3 to 5, 14, 21, 24, 26, 29, and 36 in which such aspect ratio was greater than or equal to ten, it is verified that the linearity is improved at a super long span of 7 mm which is a sever looping condition.

According to the bonding wires with a multilayer structure of the examples 1 to 5, 9 to 21, and 23 to 39, it is verified that flaws and scraping on a wire surface are reduced in thin wires having a wire diameter of 22 μm because the ratio of the area (<111> area ratio) of crystal grains where crystalline orientations in the wire lengthwise direction in the surface of the skin layer were <111> relative to the wire surface was greater than or equal to 30% according to the present invention. Preferably, according to the examples 3 to 5, 11, 14, 16, 18, 20, 21, 23, 26, 29, 30, 31, 33 to 36, and 39 in which such <111> area ratio was greater than or equal to 40%, it is verified that flaws and scraping are suppressed even in the case of an extremely thin wire with a further smaller diameter of 18 μm. More preferably, according to the examples 4, 5, 20, 21, 29, and 35 in which such <111> area ratio was greater than or equal to 50%, it is verified that an effect of suppressing any formation of flaws and scraping is further enhanced.

According to the bonding wires with a multilayer structure of the examples 25 to 30, it is verified that a peel strength at a wedge bonded part is enhanced because the <111> orientation percentage was greater than or equal to 50% and the intermediate metal layer was formed between the skin layer and the core member.

According to the bonding wires with a multilayer structure of the examples 1 to 30, and 33 to 39, it is verified that abnormal deformation of a ball bonded part is reduced, and the shape thereof is stabilized at a normal ball size because the total orientation percentage of the <111> orientation and the <100> orientation at the cross section of the core member was greater than or equal to 15% according to the present invention.

According to the bonding wires with a multilayer structure of the examples 1 to 32, and 34 to 39, it is verified that any chip damage is reduced and good because the thickness of the skin layer was within a range from 0.005 to 0.2 μm according to the present invention. As a comparative example, according to the example 33, it is verified that chip damage increases because the thickness of the skin layer exceeded 0.2 μm.

According to the bonding wires with a multilayer structure of the examples 1 to 9, 11 to 31, and 33 to 39, it is verified that there is no peeling above a loop and the adhesiveness of the skin layer is good because a diffusion layer having a concentration gradient was formed between the skin layer and the core member according to the present invention.

According to the bonding wires with a multilayer structure of the examples 2, 8, 9, 12, 27, 33, and 34, it is verified that the linearity of a loop at a span of 5 mm or so is improved because the core member mainly composed of Cu and contains greater than or equal to one kind of followings: B; Pd; P; and Zr at a concentration within a range from 5 to 300 ppm according to the present invention. Likewise, according to the examples 17, 19, 20, 22, and 30, it is verified that the linearity is improved because the core member mainly composed of Au and contains greater than or equal to one kind of followings: Be; Ca; Ni; and Pd according to the present invention. Regarding the effect of improving the linearity of a loop at a 5-mm span or so, it is also effective to set the aspect ratio in lengthwise direction/circumferential direction to be greater than or equal to five as explained above, but it may be difficult in some times to distinguish such effect from the effect acquired by addition of an alloy element. In contrast, according to the examples 9, 12, 17, 19, and 33, it is verified that the linearity at a 5-mm span or so can be improved because the foregoing alloy element was contained even though the aspect ratio was less than five.

According to the bonding wires with a multilayer structure of the examples 8, 34 to 37, and 39, it is verified that a good effect of reducing any peeling and scraping in the vicinity of the top surface of a loop is accomplished because the core member mainly composed of Cu and contains Pd within a range from 5 to 10000 ppm, and the skin layer mainly composed of Pd or Ag according to the present invention. Preferably, according to the examples 8, 35 to 37, and 39, the foregoing effect becomes more remarkable because the Pd concentration was greater than or equal to 200 ppm. Moreover, according to the examples 8, 34 to 36, and 39, it is verified that any chip damage is suppressed because the Pd content was within a range from 5 to 8000 ppm.

The invention claimed is:

1. A bonding wire for semiconductor devices, the bonding wire comprising:
   a core member formed of an electrically-conductive metal; and
   a skin layer formed on the core member and mainly composed of a metal different from the core member, and wherein
   the metal of the skin layer is a face-centered cubic metal,
   a thickness of the skin layer is within a range from 0.005 to 0.09 µm,
   an orientation ratio of <111> orientations in crystalline orientations <hkl> in a wire lengthwise direction at a crystal face of a surface of the skin layer is greater than or equal to 50%, and
   said <111> orientations have an angular difference relative to the wire lengthwise direction, said angular difference being within 15 degrees.

2. The semiconductor-device bonding wire according to claim 1, further comprising a diffusion layer formed between the skin layer and the core member and having a concentration gradient of each main constituent of the skin layer and the core member.

3. The semiconductor-device bonding wire according to claim 2, wherein a main constituent of the skin layer is at least one of the followings: Pd; Pt; Ru; and Ag.

4. The semiconductor-device bonding wire according to claim 3, wherein a main constituent of the core member is at least one of the followings: Cu; and Au.

5. The semiconductor-device bonding wire according to claim 4, wherein the main constituent of the core member is Cu and the core member contains one or more of the followings: B; Pd; Bi; P; and Zr at a concentration within a range from 5 to 300 ppm in total.

6. The semiconductor-device bonding wire according to claim 4, wherein the main constituent of the core member is Cu and the core member contains Pd at a concentration within a range from 5 to 10000 ppm, and the main constituent of the skin layer is Pd or Ag.

7. The semiconductor-device bonding wire according to claim 4, wherein the main constituent of the core member is Au and the core member contains one or more of the followings: Be; Ca; Ni; Pd and Pt at a concentration within a range from 5 to 8000 ppm in total.

8. The semiconductor-device bonding wire according to claim 3, wherein the main constituent of the core member is Cu and the core member contains one or more of the followings: B; Pd; Bi; P; and Zr at a concentration within a range from 5 to 300 ppm in total.

9. The semiconductor-device bonding wire according to claim 3, wherein the main constituent of the core member is Cu and the core member contains Pd at a concentration within a range from 5 to 10000 ppm, and the main constituent of the skin layer is Pd or Ag.

10. The semiconductor-device bonding wire according to claim 3, wherein the main constituent of the core member is Au and the core member contains one or more of the followings: Be; Ca; Ni; Pd and Pt at a concentration within a range from 5 to 8000 ppm in total.

11. The semiconductor-device bonding wire according to claim 2, wherein a main constituent of the core member is at least one of the followings: Cu; and Au.

12. The semiconductor-device bonding wire according to claim 11, wherein the main constituent of the core member is Cu and the core member contains one or more of the followings: B; Pd; Bi; P; and Zr at a concentration within a range from 5 to 300 ppm in total.

13. The semiconductor-device bonding wire according to claim 11, wherein the main constituent of the core member is Cu and the core member contains Pd at a concentration within a range from 5 to 10000 ppm, and the main constituent of the skin layer is Pd or Ag.

14. The semiconductor-device bonding wire according to claim 11, wherein the main constituent of the core member is Au and the core member contains one or more of the followings: Be; Ca; Ni; Pd and Pt at a concentration within a range from 5 to 8000 ppm in total.

15. The semiconductor-device bonding wire according to claim 1, wherein a main constituent of the skin layer is at least one of the followings: Pd; Pt; Ru; and Ag.

16. The semiconductor-device bonding wire according to claim 15, wherein a main constituent of the core member is at least one of the followings: Cu; and Au.

17. The semiconductor-device bonding wire according to claim 16, wherein the main constituent of the core member is Cu and the core member contains one or more of the followings: B; Pd; Bi; P; and Zr at a concentration within a range from 5 to 300 ppm in total.

18. The semiconductor-device bonding wire according to claim 16, wherein the main constituent of the core member is Cu and the core member contains Pd at a concentration within a range from 5 to 10000 ppm, and the main constituent of the skin layer is Pd or Ag.

19. The semiconductor-device bonding wire according to claim 16, wherein the main constituent of the core member is Au and the core member contains one or more of the followings: Be; Ca; Ni; Pd and Pt at a concentration within a range from 5 to 8000 ppm in total.

20. The semiconductor-device bonding wire according to claim 15, wherein the main constituent of the core member is Cu and the core member contains one or more of the followings: B; Pd; Bi; P; and Zr at a concentration within a range from 5 to 300 ppm in total.

21. The semiconductor-device bonding wire according to claim 15, wherein the main constituent of the core member is Cu and the core member contains Pd at a concentration within a range from 5 to 10000 ppm, and the main constituent of the skin layer is Pd or Ag.

22. The semiconductor-device bonding wire according to claim 15, wherein the main constituent of the core member is Au and the core member contains one or more of the followings: Be; Ca; Ni; Pd and Pt at a concentration within a range from 5 to 8000 ppm in total.

23. The semiconductor-device bonding wire according to claim 1, wherein a main constituent of the core member is at least one of the followings: Cu; and Au.

24. The semiconductor-device bonding wire according to claim 23, wherein the main constituent of the core member is Cu and the core member contains one or more of the followings: B; Pd; Bi; P; and Zr at a concentration within a range from 5 to 300 ppm in total.

25. The semiconductor-device bonding wire according to claim 23, wherein the main constituent of the core member is Cu and the core member contains Pd at a concentration within a range from 5 to 10000 ppm, and the main constituent of the skin layer is Pd or Ag.

26. The semiconductor-device bonding wire according to claim 23, wherein the main constituent of the core member is Au and the core member contains one or more of the followings: Be; Ca; Ni; Pd and Pt at a concentration within a range from 5 to 8000 ppm in total.

* * * * *